US009111893B2

(12) United States Patent
Ebisuno et al.

(10) Patent No.: US 9,111,893 B2
(45) Date of Patent: Aug. 18, 2015

(54) DISPLAY DEVICE

(71) Applicant: JOLED INC., Tokyo (JP)

(72) Inventors: Kouhei Ebisuno, Kyoto (JP); Shinya Ono, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/390,547

(22) PCT Filed: Feb. 19, 2013

(86) PCT No.: PCT/JP2013/000902
§ 371 (c)(1),
(2) Date: Oct. 3, 2014

(87) PCT Pub. No.: WO2013/171938
PCT Pub. Date: Nov. 21, 2013

(65) Prior Publication Data
US 2015/0053953 A1  Feb. 26, 2015

(30) Foreign Application Priority Data
May 16, 2012  (JP) ................................ 2012-112800

(51) Int. Cl.
H01L 23/12 (2006.01)
H01L 27/32 (2006.01)
G09G 3/32 (2006.01)

(52) U.S. Cl.
CPC .......... *H01L 27/3279* (2013.01); *G09G 3/3233* (2013.01); *H01L 27/3262* (2013.01); *H01L 27/3265* (2013.01); *G09G 2300/0842* (2013.01); *G09G 2300/0852* (2013.01);

(Continued)

(58) Field of Classification Search
CPC ................. H01L 2924/01087; H01L 27/3297
USPC ............ 250/214.1, 208.1; 257/292, 400, 700
See application file for complete search history.

(56) References Cited

U.S. PATENT DOCUMENTS 7,274,345 B2  9/2007 Imamura et al.
7,329,849 B2  2/2008 Kasai
(Continued)

FOREIGN PATENT DOCUMENTS

JP  2005-004173  1/2005
JP  2006-301159  11/2006
(Continued)

OTHER PUBLICATIONS

Search report from PCT/JP2013/000902, mail date is May 28, 2013.

*Primary Examiner* — Dale E Page
(74) *Attorney, Agent, or Firm* — Greenblum & Bernstein, P.L.C.

(57) ABSTRACT

A display device including pixels, in which each of the pixels includes: a positive power supply line and a negative power supply line; a drive transistor that drives a current in a current path according to a gate-source voltage; an organic EL element including an anode and a cathode that are disposed in the current path; an electrostatic storage capacitor that stores the gate-source voltage by having a first electrode connected to a gate of the drive transistor, and a second electrode connected to a source of the drive transistor; a switch transistor that switches a conduction state between the second electrode and a data line; and a switch transistor for applying a negative power supply line voltage to the first electrode. A potential difference between a first power supply line voltage VDDp and a second power line voltage VEEp decreases with proximity to the center of a display unit.

27 Claims, 14 Drawing Sheets

(52) U.S. Cl.
CPC ............... *G09G 2310/0251* (2013.01); *G09G 2310/0262* (2013.01); *G09G 2320/0233* (2013.01); *G09G 2320/043* (2013.01); *H01L 27/3276* (2013.01)

(56) References Cited

U.S. PATENT DOCUMENTS

| | | |
|---|---|---|
| 8,018,404 B2 | 9/2011 | Ono |
| 8,248,331 B2 | 8/2012 | Ono |
| 8,305,305 B2 | 11/2012 | Ono |
| 8,552,655 B2 | 10/2013 | Ono |
| 8,749,454 B2 | 6/2014 | Ono |
| 2004/0257353 A1 | 12/2004 | Imamura et al. |
| 2006/0231740 A1* | 10/2006 | Kasai ..................... 250/214.1 |
| 2007/0296652 A1 | 12/2007 | Imamura et al. |
| 2010/0109985 A1* | 5/2010 | Ono ........................ 345/76 |
| 2010/0259531 A1* | 10/2010 | Ono ........................ 345/212 |
| 2011/0063275 A1 | 3/2011 | Imamura et al. |
| 2011/0164024 A1 | 7/2011 | Ono |
| 2011/0285760 A1 | 11/2011 | Ono |
| 2012/0062130 A1 | 3/2012 | Ono |

FOREIGN PATENT DOCUMENTS

| | | |
|---|---|---|
| JP | 2006-308845 | 11/2006 |
| JP | 2008-281897 | 11/2008 |
| JP | 2011-164641 | 8/2011 |
| WO | 2009/011092 | 1/2009 |
| WO | 2010/041426 | 4/2010 |
| WO | 2010/137298 | 12/2010 |

* cited by examiner

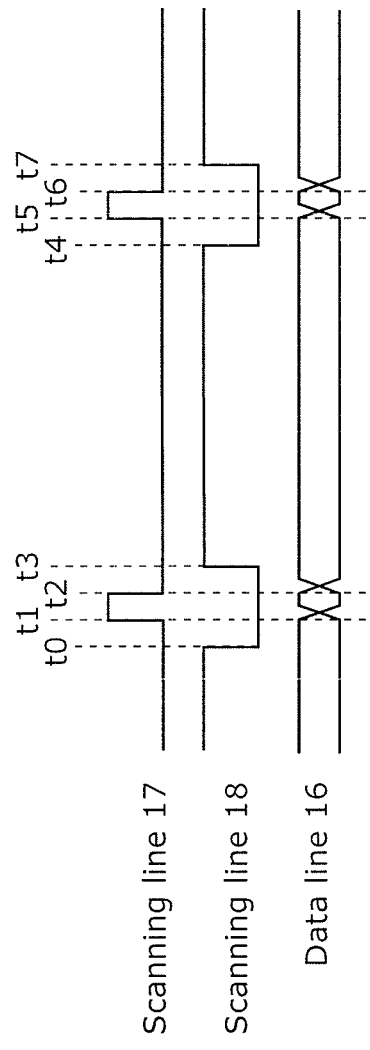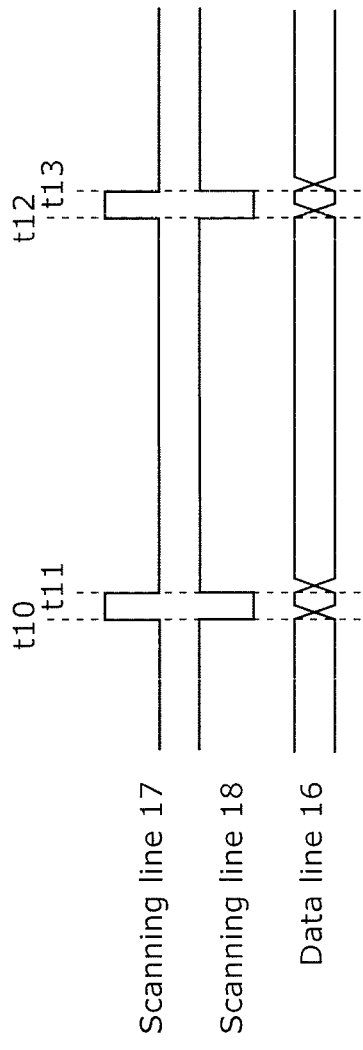

Writing

Light-emission

DISPLAY DEVICE

TECHNICAL FIELD

The present invention relates to active-matrix display devices which use current-driven light-emitting elements represented by organic EL elements, and more particularly to improving picture quality of a display device.

BACKGROUND ART

Image display devices using organic electroluminescence (EL) elements are well-known as image display devices using current-driven light-emitting elements. An organic EL display device using such self-luminous organic EL elements does not require backlights needed in a liquid crystal display device and is best suited for increasing device thinness. Furthermore, since viewing angle is not restricted, practical application as a next-generation display device is expected. Furthermore, the organic EL elements used in the organic EL display device are different from liquid crystal cells which are controlled according to the voltage applied thereto, in that the luminance of the respective light-emitting elements is controlled according to the value of the current flowing thereto.

In the organic EL display device, the organic EL elements included in the pixels are normally arranged in a matrix. Here, a switching thin film transistor (TFT) is provided in each crosspoint between scanning lines and data lines, the gate electrode of a drive element is connected to the switching TFT, the switching TFT is turned ON through a selected scanning line so as to input a data signal from a data line to the drive element. A display device in which the organic EL element is driven by such a driving element is called an active-matrix organic EL display device.

In an active-matrix organic EL display device, in order to realize high-precision image display, data voltage reflecting a video signal needs to be accurately stored in the pixel circuit. In other words, in the drive element, in order to cause a drive current corresponding to the data voltage to flow to the light-emitting element, the data voltage needs to be accurately stored between the gate and source of the drive element.

Patent Literature (PTL) 1 discloses an image display device having a circuit configuration for accurately storing a data voltage reflecting a video signal into a pixel to realize high-precision image display.

FIG. 13 is a diagram illustrating a circuit configuration of a pixel included in the image display device disclosed in PTL 1. A pixel 510 in the figure includes: switch transistors 511, 512, and 519; an electrostatic storage capacitor 513; a drive transistor 514; an organic EL element 515; a data line 516; scanning lines 517 and 518, a reference power supply line 520; a positive power supply line 521; and a negative power supply line 522. A data voltage storing operation and a light emission operation in the circuit configuration will be described below.

First, a scanning line drive circuit 504 turns ON the switch transistors 511 and 512 in a state where the switch transistor 519 is OFF. Accordingly, a reference voltage VREF of the reference power supply line 520 is applied to an electrode 531, and a data voltage Vdata is applied to the electrode 532 from the data line 516. At this time, since the drain current of the drive transistor 514 does not flow, the organic EL element 515 does not emit light. In this data voltage storing period, voltage drop due to a steady-state current does not occur because only a capacitive load is connected to the reference power supply line 520. Therefore, accurate voltages VREF and Vdata corresponding to the data voltage are respectively stored in the electrode 531 and the electrode 532 of the electrostatic storage capacitor 513.

Next, the scanning line drive circuit 504 turns OFF the switch transistors 511 and 512 to cause a state of non-conduction between the electrode 531 and the reference power supply line 520 and cause a state of non-conduction between the electrode 532 and the data line 516.

Next, the scanning line drive circuit 504 turns ON the switch transistor 519 to cause a state of conduction between the source electrode of the drive transistor 514 and the electrode 532. Here, the electrode 531 is blocked off from the reference power supply line 520, and the electrode 532 is blocked off from the data line 516. Therefore, a gate potential of the drive transistor 514 changes together with the change of the source potential, and (VREF−Vdata), which is the voltage across the electrostatic storage capacitor 513, is applied between the gate and the source, and thus a current corresponding to this (VREF−Vdata) flows in the organic EL element 515, and a light emission operation is executed.

As described above, according to the image display device disclosed in PTL 1, the current flowing in the drive transistor only passes via the light-emitting element at all times, and thus at the time of data voltage storing, the steady-state current does not flow in the reference power supply line and the data line. Accordingly, accurate potentials can be stored in the electrodes on both ends of the electrostatic storage capacitor having a function of storing voltage to be applied between the gate and the source of the drive transistor. Therefore, unevenness in the luminance of light-emitting elements can be suppressed, and high-precision image display reflecting the video signal becomes possible.

CITATION LIST

Patent Literature

[PTL 1] Japanese Unexamined Patent Application Publication No. 2011-164641

SUMMARY OF INVENTION

Technical Problem

However, in the pixel circuit included in the conventional image display device disclosed in PTL 1, although voltage can be stored accurately during data voltage storing, when light emission is started, the voltage between the gate and source of the drive transistor 514 changes as an effect of voltage drop in the power supply line due to conduction in the switch transistor 519. Since the current flowing to the light-emitting element is supplied from a power supply located on the periphery of a display panel, via the power supply line, a voltage drop corresponding to the wire resistance occurs in the power supply line, from the periphery of the display panel to the center thereof. The change in the voltage between the gate and the source of the drive transistor 514 caused by the voltage drop in the power supply line causes the occurrence of defects such as the luminance at the central portion of the display panel deteriorating regardless of the video signal.

In contrast, since a viewer's line of sight is focused on the screen central portion, ensuring the luminance at the screen central portion is an important factor in improving picture quality.

In view of the aforementioned problem, the present invention has as an object to provide a display device having picture quality that is improved through a simple pixel circuit.

Solution to Problem

In order to achieve the above-described object, a display device according to an aspect of the present invention is a display device including a display unit in which a plurality of light-emitting pixels are arranged, wherein each of the plurality of light-emitting pixels includes: a first power supply line; a second power supply line; a drive transistor that includes a source electrode and a drain electrode that are disposed in a current path between the first power supply line and the second power supply line, and drives a current in the current path according to a gate-source voltage; a light-emitting element that includes an anode electrode and a cathode electrode that are disposed in the current path, and emits light according to the current; a capacitive element that includes a first electrode and a second electrode, and stores the gate-source voltage of the drive transistor when the first electrode is electrically connected to a gate electrode of the drive transistor and the second electrode is electrically connected to the source electrode of the drive transistor; a first switch element that switches between conduction and non-conduction between one of the first electrode and the second electrode of the capacitive element and a data line that transmits a data voltage corresponding to luminance; and a second switch element for applying a reference voltage to an other of the first electrode and the second electrode of the capacitive element. Here, a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line. The reference voltage in each of the plurality of light-emitting pixels is set according to one of the first power supply line voltage and the second power supply line voltage of the light-emitting pixel. In a storing period for storing data voltage, causing the first switch element and the second switch element to switch to conduction causes a voltage to be stored in the capacitive element, the voltage being obtained by adding, to the data voltage, a voltage equivalent to one of an amount of voltage drop and an amount of voltage rise in one of the first power supply line and the second power supply line. In a light emission period, the light-emitting element emits light according to the voltage stored in the capacitive element.

Advantageous Effects of Invention

With the display device according to the present invention, a voltage obtained by adding the amount of the voltage drop in the power supply line to the data voltage is stored in the pixel, and thus it is possible to increase the light emission luminance at the screen central portion where the amount of voltage drop is larger than at a screen peripheral portion. Therefore, it is possible to provide a display device having a picture quality in which the screen central portion is relatively brighter than the screen peripheral portion.

BRIEF DESCRIPTION OF DRAWINGS

FIG. 3A is an operation timing chart for a method of driving the display device according to the embodiment of the present invention.

FIG. 3B is an operation timing chart illustrating a modification of the method of driving the display device according to the embodiment of the present invention.

DESCRIPTION OF EMBODIMENTS (Underlying Knowledge Forming the Basis of the Present Invention)

The inventors found that the following problems occur with the image display device described in the "Background Art" section.

Figure 14A:
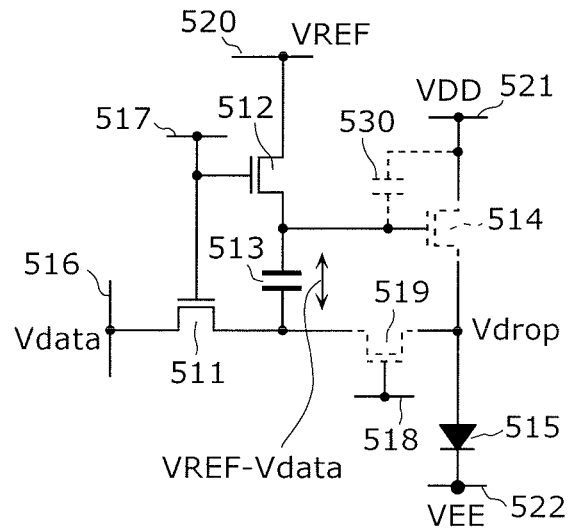
FIG. 14A is a diagram illustrating a state of conduction in a pixel circuit during storing in the conventional image display device disclosed in PTL 1.

FIG. 14A is a diagram illustrating a state of conduction in a pixel circuit during storing in the conventional image display device disclosed in PTL 1. An operation of storing into a pixel will be described using the figure.

In the case of storing the data voltage Vdata from the data line 516 to the pixel, a scanning signal of the scanning line 517 causes the switch transistors 511 and 512 to switch to the conducting state. Since the electrostatic storage capacitor 513 is connected to the data line 516 and the reference power supply line 520, the voltage (VREF−Vdata) is stored in the electrostatic storage capacitor 513. At this time, since the drive transistor 514 and the switch transistor 519 are in a state of non-conduction, the steady-state current does not flow in the positive power supply line 521, the negative power supply line 522, the reference power supply line 520, and the data line 516. With this, an accurate voltage corresponding to the data voltage is stored in the electrodes on both ends of the electrostatic storage capacitor 513 which stores the voltage to be applied between the gate and the source of the drive transistor 514.

Figure 14B:
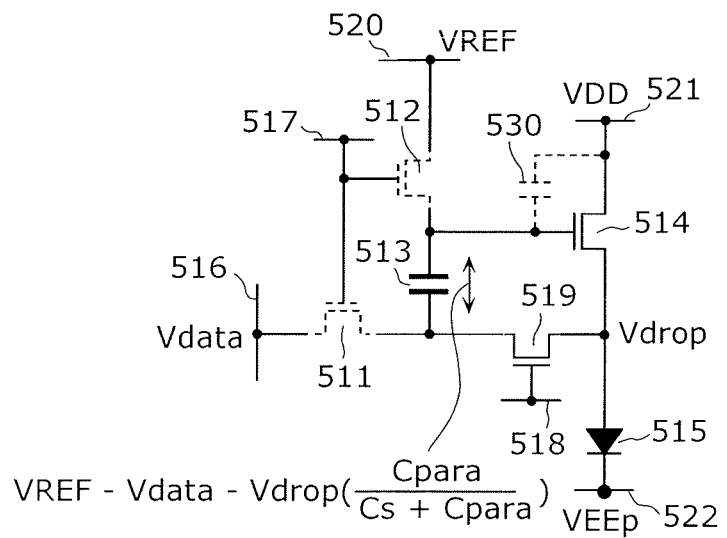
FIG. 14B is a diagram illustrating a conducting state in a pixel circuit during light emission in the conventional image display device disclosed in PTL 1.

FIG. 14B is a diagram illustrating a state of conduction in a pixel circuit during light emission in the conventional image display device disclosed in PTL 1. A light emission operation of the pixel will be described using the figure.

When the storing of the data voltage Vdata into the electrostatic storage capacitor 513 is completed, a scanning signal of the scanning line 517 causes the switch transistors 511 and 512 to switch to the non-conducting state. Accordingly, there is no conduction between the electrostatic storage capacitor 513 and the data line 516 and the reference power supply line 520. In this state, the scan signal of the scanning line 518 causes the switch transistor 519 to switch to the conducting state, thereby causing a state of conduction between the electrostatic storage capacitor 513 and the gate electrode and source electrode of the drive transistor 514. With this, the voltage (VREF−Vdata) stored in the electrostatic storage capacitor 513 is applied between the gate and the source of the drive transistor 514.

Here, it is assumed that a voltage drop (rise) Vdrop occurs in the negative power supply line 522 due to the wire resistance of the negative power supply line 522 and the drive current. In other words, the voltage VEEp of the negative power supply line 522 in the pixel 510 is as expressed below.

[Math. 1]

$$VEEp = GND + Vdrop \quad \text{(Equation 1)}$$

Due to the flow of drive current into the organic EL element 515, with the potential of the negative power supply line 522 in the pixel 510 being in the state indicated in Equation 1 above, the source potential of the drive transistor 514 also rises, together with the potential of the negative power supply line 522, by an amount equivalent to Vdrop, as compared to the state where there is no voltage drop (normally, source potential=potential of the negative power supply line 522+anode-cathode voltage of the organic EL element 515. However, the voltage drop Vdrop causes the source potential to rise above than the normal source potential by the amount of the Vdrop). At this time, the gate electrode of the drive transistor 514 is in a floating state, and thus the gate potential rises in accordance with the change of the source potential. Here, a parasitic capacitance 530 is present between the gate and the drain of the drive transistor 514, and the capacitance value of the parasitic capacitor 530 is assumed to be Cpara. In this case, a change in the gate potential ΔVg of the drive transistor 514 is Vdrop×Cs/(Cs+Cpara) with respect to the change in the source potential Vdrop. It should be noted that Cs is the capacitance value of the electrostatic storage capacitor 513. Therefore, the gate-source voltage Vgs of the drive transistor 514 is derived from the voltage (VREF−Vdata) stored in the electrostatic storage capacitor 513, the change in the gate voltage ΔVg, and the change in the source voltage ΔVs, as shown below.

[Math. 2]

$$\begin{aligned} Vgs &= (VREF - Vdata) + \Delta Vg - \Delta Vs \quad \text{(Equation 2)} \\ &= (VREF - Vdata) + \left(\frac{Cs}{Cs + Cpara}\right)Vdrop - Vdrop \\ &= (VREF - Vdata) - \left(\frac{Cpara}{Cs + Cpara}\right)Vdrop \end{aligned}$$

According to Equation 2 above, the Vgs at the start of light emission decreases by (Cpara/Cs+Cpara)×Vdrop from the stored voltage (VREF−Vdata) due to the voltage drop (rise) in the negative power line 522. Furthermore, a drive current Id flowing in the organic EL element 515 is expressed as follows:

[Math. 3]

$$\begin{aligned} Id &= \beta(Vgs - Vth)^2 \quad \text{(Equation 3)} \\ &= \beta\left[\left\{(VREF - Vdata) - \left(\frac{Cpara}{Cs + Cpara}\right)Vdrop\right\} - Vth\right]^2 \end{aligned}$$

Here β and Vth are, respectively, the mobility and the threshold voltage of the drive transistor 514. According to Equation 3 above, the drive current Id also decreases, and thus the light emission luminance of the organic EL element 515 deteriorates. Due to this deterioration in light emission luminance, the screen central portion where the voltage drop (rise) is larger becomes dark.

As described above, in the conventional image display device disclosed in PTL 1, the voltage drop in the power supply line causes the screen central portion to become dark, thus making it difficult to maintain high picture quality. Since the viewer's line of sight is focused on the screen central portion, making the screen central portion brighter than the peripheral portion, improves the picture quality of the display panel.

In order to solve such a problem, a display device according to an aspect of the present invention is a display device including a display unit in which a plurality of light-emitting pixels are arranged, wherein each of the plurality of light-emitting pixels includes: a first power supply line; a second power supply line; a drive transistor that includes a source electrode and a drain electrode that are disposed in a current path between the first power supply line and the second power supply line, and drives a current in the current path according to a gate-source voltage; a light-emitting element that includes an anode electrode and a cathode electrode that are disposed in the current path, and emits light according to the current; a capacitive element that includes a first electrode and a second electrode, and stores the gate-source voltage of the drive transistor when the first electrode is electrically connected to a gate electrode of the drive transistor and the second electrode is electrically connected to the source electrode of the drive transistor; a first switch element that switches between conduction and non-conduction between one of the first electrode and the second electrode of the capacitive element and a data line that transmits a data voltage corresponding to luminance; and a second switch element for applying a reference voltage to an other of the first electrode and the second electrode of the capacitive element. Here, a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line. The reference voltage in each of the plurality of light-emitting pixels is set according to one of the first power supply line voltage and the second power supply line voltage of the light-emitting pixel. In a storing period for storing data voltage, causing the first switch element and the second switch element to switch to conduction causes a voltage to be stored in the capacitive element, the voltage being obtained by adding, to the data voltage, a voltage equivalent to one of an amount of voltage drop and an amount of voltage rise in one of the first power supply line and the second power supply line. In a light emission period, the light-emitting element emits light according to the voltage stored in the capacitive element.

According to this aspect, at the time of data voltage storing, data voltage is applied, via the first switch element, to one of the first electrode and the second electrode of the capacitive element that is connectable to the source electrode of the drive transistor, and the voltage of the power source line which changes depending on the pixel location is applied, via the second switch element, to the other of the first electrode and the second electrode of the capacitive element that is connectable to the gate electrode of the drive transistor. With this, it is possible to store, in the capacitive element, a voltage obtained by adding the absolute value of the amount of voltage change in the power supply line to the absolute value of the data voltage. Accordingly, for example, it is possible to relatively increase the light emission luminance at the screen central portion where the amount of voltage drop (rise) in the power supply line caused by wire resistance and current is larger than at the screen peripheral portion. Therefore, the screen central portion on which the line of sight of a viewer tends to concentrate can be made brighter than the screen peripheral portion, and thus high picture quality can be provided.

Furthermore, since there is no need to provide a separate reference power supply line for supplying the reference voltage to be applied to one of the first electrode and the second electrode of the capacitive element, the circuit wiring can be simplified. This promotes miniaturization of pixels, thus allowing for further high-definition in the display panel.

Furthermore, for example, in at least one light-emitting pixel of the plurality of light-emitting pixels: the drive transistor may be of an n-type; the drain electrode and the source electrode of the drive transistor and the anode electrode and the cathode electrode of the light-emitting element may be disposed in the current path; the reference voltage may be the second power supply line voltage of the at least one light-emitting pixel; the first switch element may switch between conduction and non-conduction between the second electrode of the capacitive element and the data line; and the second switch element may switch between conduction and non-conduction between the first electrode of the capacitive element and the second power supply line.

In the case of a circuit configuration in which data voltage is applied to the second electrode of the capacitive element that is connectable to the source electrode of an n-type drive transistor at the time of storing data voltage by causing the first and the second switch elements to switch to the conducting state, the voltage of the second power supply line having a positive potential change is applied to the gate electrode of the n-type drive transistor. Accordingly, the gate-source voltage of the drive transistor at the start of light emission becomes larger than the accurate voltage corresponding to the data voltage. Furthermore, since the amount of voltage rise in the second power supply line is larger at the screen central portion than at the screen peripheral portion, the light emission luminance in the screen central portion can be made relatively higher.

Furthermore, for example, in at least one light-emitting pixel of the plurality of light-emitting pixels: the drive transistor may be of an n-type; the drain electrode and the source electrode of the drive transistor and the anode electrode and the cathode electrode of the light-emitting element may be disposed in the current path; the reference voltage may be the first power supply line voltage of the at least one light-emitting pixel; the first switch element may switch between conduction and non-conduction between the first electrode of the capacitive element and the data line; and the second switch element may switch between conduction and non-conduction between the second electrode of the capacitive element and the first power supply line.

In the case of a circuit configuration in which data voltage is applied to the first electrode of the capacitive element that is connectable to the gate electrode of an n-type drive transistor at the time of storing data voltage by causing the first and the second switch elements to switch to the conducting state, the voltage of the first power supply line having a negative potential change is applied to the source electrode of the n-type drive transistor. Accordingly, the gate-source voltage of the drive transistor at the start of light emission becomes larger than the accurate voltage corresponding to the data voltage. Furthermore, since the amount of voltage drop in the first power supply line is larger at the screen central portion than at the screen peripheral portion, the light emission luminance in the screen central portion can be made relatively higher.

Furthermore, for example, in at least one light-emitting pixel of the plurality of light-emitting pixels: the drive transistor may be of an p-type; the drain electrode and the source electrode of the drive transistor and the anode electrode and the cathode electrode of the light-emitting element may be disposed in the current path; the reference voltage may be the first power supply line voltage of the at least one light-emitting pixel; the first switch element may switch between conduction and non-conduction between the second electrode of the capacitive element and the data line; and the second switch element may switch between conduction and non-conduction between the first electrode of the capacitive element and the first power supply line.

In the case of a circuit configuration in which data voltage is applied to the second electrode of the capacitive element that is connectable to the source electrode of a p-type drive transistor at the time of storing data voltage by causing the first and the second switch elements to switch to the conducting state, the voltage of the first power supply line having a negative potential change is applied to the gate electrode of the p-type drive transistor. Accordingly, the absolute value of the gate-source voltage of the drive transistor at the start of light emission becomes larger than the absolute value of the accurate voltage corresponding to the data voltage. Furthermore, since the amount of voltage drop in the first power supply line is larger at the screen central portion than at the screen peripheral portion, the light emission luminance in the screen central portion can be made relatively higher.

Furthermore, for example, in at least one light-emitting pixel of the plurality of light-emitting pixels: the drive transistor may be of an p-type; the drain electrode and the source electrode of the drive transistor and the anode electrode and the cathode electrode of the light-emitting element may be disposed in the current path; the reference voltage may be the second power supply line voltage of the at least one light-emitting pixel; the first switch element may switch between conduction and non-conduction between the first electrode of the capacitive element and the data line; and the second switch element may switch between conduction and non-conduction between the second electrode of the capacitive element and the second power supply line.

In the case of a circuit configuration in which data voltage is applied to the first electrode of the capacitive element that is connectable to the gate electrode of a p-type drive transistor at the time of storing data voltage by causing the first and the second switch elements to switch to the conducting state, the voltage of the second power supply line having a positive potential change is applied to the source electrode of the p-type drive transistor. Accordingly, the absolute value of the gate-source voltage of the drive transistor at the start of light emission becomes larger than the absolute value of the accurate voltage corresponding to the data voltage. Furthermore, since the amount of voltage rise in the second power supply line is larger at the screen central portion than at the screen peripheral portion, the light emission luminance in the screen central portion can be made relatively higher.

Furthermore, for example, each of the plurality of light-emitting pixels may further include a third switch element that switches between conduction and non-conduction between the source electrode of the drive transistor and the second electrode of the capacitive element.

Accordingly, the switching of the third switch element to the non-conducting state at the time of storing data voltage makes it possible to cut-off the generation path of steady current other than the current generated in a charging operation of the capacitive element in the storing period. Therefore, a voltage corresponding to the data voltage and the power supply line voltage is stored in the first electrode and the second electrode of the capacitive element. Furthermore, since the switching of the third switch element to the conductive state at the start of light emission causes the voltage stored in the capacitive element to be applied between the gate and the source of the drive transistor, the light-emitting element emits light at a luminance corresponding to the data voltage and the power supply line voltage.

Furthermore, for example, the drive transistor may be of an enhancement type.

Accordingly, in the case where the drive transistor is, for example, of the n-type, at the time of storing data voltage, the second power supply line voltage is applied to the gate electrode of the drive transistor. However, a voltage that is larger than the second power supply voltage by the amount of the light emission threshold voltage of the organic EL element is applied to the source electrode of the drive transistor, and thus a voltage that is less than or equal to 0 V is applied between the gate electrode and the source electrode of the drive transistor. Therefore, in the enhancement type in which the threshold voltage of the drive transistor is larger than 0 V, the drive transistor is turned OFF. Accordingly, at this time, the drain current of the drive transistor does not flow, and thus the organic EL element does not emit light.

Furthermore, a display device according to an aspect of the present invention is a display device including a display unit in which a plurality of light-emitting pixels are arranged, wherein each of the plurality of light-emitting pixels includes: a first power supply line; a second power supply line; a drive transistor that includes a source electrode and a drain electrode that are disposed in a current path between the first power supply line and the second power supply line, and drives a current in the current path according to a gate-source voltage; a light-emitting element that includes an anode electrode and a cathode electrode, and emits light according to the current; a first capacitive element that includes a first electrode and a second electrode, and stores the gate-source voltage of the drive transistor when the first electrode is electrically connected to a gate electrode of the drive transistor and the second electrode is electrically connected to the source electrode of the drive transistor; a first switch element that switches between conduction and non-conduction between the first electrode of the first capacitive element and a data line that transmits a data voltage corresponding to luminance; a second switch element for applying a reference voltage to the first electrode of the first capacitive element; and a fourth switch element that switches between conduction and non-conduction between the source electrode of the drive transistor and the anode electrode of the light-emitting element. Here, a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line. The reference voltage in each of the plurality of light-emitting pixels is set according to one of the first power supply line voltage and the second power supply line voltage of the light-emitting pixel. In a threshold voltage compensation period, causing the second switch element to switch to conduction causes one of the first power supply line voltage and the second power supply line voltage to be applied to the gate electrode of the drive transistor and a threshold voltage of the drive transistor to be stored in the first capacitive element. In a storing period for storing data voltage, causing the first switch element to switch to conduction causes a voltage to be stored in the first capacitive element, the voltage being obtained by adding, to the data voltage and the threshold voltage, a voltage equivalent to one of an amount of voltage drop and an amount of voltage rise in one of the first power supply line and the second power supply line. In a light emission period, causing the fourth switch element to switch to conduction causes the light-emitting element to emit light according to the voltage stored in the first capacitive element.

Furthermore, for example, the reference voltage may be the first power supply line voltage of the light-emitting pixel, each of the plurality of light-emitting pixels may further include a fifth switch element for applying an initialization voltage for compensating for the threshold voltage of the drive transistor, to one of the source electrode and the drain electrode of the drive transistor, and in a period up to a start of the threshold voltage compensation period, the fifth switch element is caused to switch to conduction.

Furthermore, for example, the reference voltage may be the first power supply line voltage of the light-emitting pixel, and each of the plurality of light-emitting pixels may further include a second capacitive element that includes a third electrode and a fourth electrode, the third electrode being electrically connected to the second electrode of the first capacitive element, the fourth electrode being electrically connected to an initialization voltage line capable of being set to an initialization voltage for compensating for the threshold voltage of the drive transistor.

According to this configuration, at the time of threshold voltage compensation, the power supply voltage of the first power supply line in which a voltage drop occurs is applied to the first electrode of the first capacitive element via the second switch element. With this, the source potential of the drive transistor becomes a potential from which the absolute value of the amount of voltage drop in the first power supply line has been deducted. Since the data voltage is stored in the gate electrode of the drive transistor in this state, the light emission luminance at the screen central portion, where the amount of voltage drop is larger than at the screen peripheral portion, becomes relatively brighter. Therefore, the screen central portion becomes brighter than the screen peripheral portion, and thus high picture quality can be provided.

Furthermore, for example, a display device according to an aspect of the present invention is a display device including a display unit in which a plurality of light-emitting pixels are arranged, wherein each of the plurality of light-emitting pixels includes: a first power supply line; a second power supply line; a drive transistor that includes a source electrode and a drain electrode that are disposed in a current path between the first power supply line and the second power supply line, and drives a current in the current path according to a gate-source voltage; a light-emitting element that includes an anode electrode and a cathode electrode that are disposed in the current path, and emits light according to the current; a first capacitive element that includes a first electrode and a second electrode, the second electrode being electrically connected to the source electrode of the drive transistor; a second capacitive element that includes a third electrode and a fourth electrode, the third electrode being electrically connected to a gate electrode of the drive transistor, the fourth electrode being electrically connected to the first electrode of the first capacitive element; a first switch element that switches between conduction and non-conduction between the third electrode of the second capacitive element and a data line that transmits a data voltage corresponding to luminance; a second switch element for applying a reference voltage to the first electrode of the first capacitive element; and a sixth switch element connected to the first electrode of the first capacitance element and the gate electrode of the drive transistor. Here, a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line. The reference voltage in each of the plurality of light-emitting pixels is set according to one of the first power supply line voltage and the second power supply line voltage of the light-emitting pixel. In a storing period for storing data voltage, causing the first switch element to switch to conduction causes a voltage corresponding to the data voltage to be stored in the second capacitive element. In a threshold voltage compensation period, causing the second switch to switch to conduction causes one of the first power supply line voltage and the second power supply line voltage to be applied to the first electrode of the first capacitive element, and causes a voltage corresponding to the data voltage, a voltage equivalent to one of an amount of voltage drop and an amount of voltage rise in one of the first power supply line and the second power supply line, and the threshold voltage of the drive transistor, to be stored in the first capacitive element. In a light emission period, causing the sixth switch element to switch to conduction causes the light-emitting element to emit light according to the voltage stored in the first capacitive element.

Furthermore, for example, the reference voltage may be the second power supply line voltage of the light-emitting pixel, each of the plurality of light-emitting pixels may further include a seventh switch element for applying an initialization voltage for compensating for the threshold voltage of the drive transistor, to the second electrode of the first capacitive element, and in a period up to a start of the threshold voltage compensation period, the seventh switch element is caused to switch to conduction.

Accordingly, at the time of threshold voltage compensation, the power supply voltage of the second power supply line in which a voltage rise occurs is applied to the first electrode of the first capacitive element via the second switch element. With this, the voltage across the first capacitive element becomes a potential to which the absolute value of the amount of voltage rise in the power supply line has been added. Since the first capacitive element is connected to the gate electrode of the drive transistor in this state, the light emission luminance at the screen central portion, where the amount of voltage rise is larger than at the screen peripheral portion, becomes relatively higher. Therefore, the screen central portion becomes brighter than the screen peripheral portion, and thus high picture quality can be provided.

Furthermore, for example, the second power supply line may be a common electrode that is one of the anode electrode and the cathode electrode of the light-emitting element formed in common for the plurality of light-emitting pixels, and one light-emitting pixel of the plurality of light-emitting pixels may have a connection point at which one of a source electrode and a drain electrode of the second switch element and the common electrode corresponding to the light-emitting pixel are electrically connected.

Accordingly, at the time of storing data voltage, conduction in the second switch element causes the potential of the common electrode described above to be applied to the one of the two electrodes of the capacitive element to which data voltage is not applied.

Therefore, the pixel interval at which the connection point is to be provided can be determined according to the degree of the potential change in the common electrode.

Furthermore, for example, the connection point may be provided one for each of the plurality of light-emitting pixels.

With this, the light emission luminance of a light-emitting pixel can be precisely changed according to the location of the light-emitting pixel in the display unit.

Furthermore, for example, the connection point may be provided in common to two or more adjacent light-emitting pixels of the plurality of light-emitting pixels.

Accordingly, for example, in a colored display device in which an adjacent red pixel, green pixel, and blue pixel make up a single unit pixel, the light emission luminance of the light-emitting pixels can be changed on a unit pixel basis.

Furthermore, for example, the common electrode may be formed from a conductive metal oxide.

Furthermore, for example, the common electrode may be formed from a material having a sheet resistance of at least 1 $\Omega$/sq.

Compared to a highly conductive metal electrode, the common electrode comprising a metal oxide has a high resistance. With this, the change in the amount of voltage drop (rise) of the common electrode, which is in accordance with the location of the common electrode inside the display unit, is larger than the change in the amount of voltage drop (rise) of a metal electrode. Therefore, it is possible to set a significant change in the light emission luminance which is in accordance with the location in the display unit can be set.

Hereinafter, a display device according to an aspect of the present invention will be described with reference to the drawings. Furthermore, in the following figures, the same reference signs are used for the same structural elements.

It should be noted that the embodiment described below shows one preferred specific example. The numerical values, shapes, materials, structural elements, the arrangement and connection of the structural elements, etc. shown in the following exemplary embodiment are mere examples, and therefore do not limit the scope of the present invention. Furthermore, among the structural elements in the following exemplary embodiment, structural elements not recited in any one of the independent claims indicating the broadest concepts of the present invention are described as arbitrary structural elements included in a preferred embodiment.

Hereinafter, an embodiment of the present invention will be described with reference to the drawings.

(Pixel Circuit Configuration)

Figure 1:
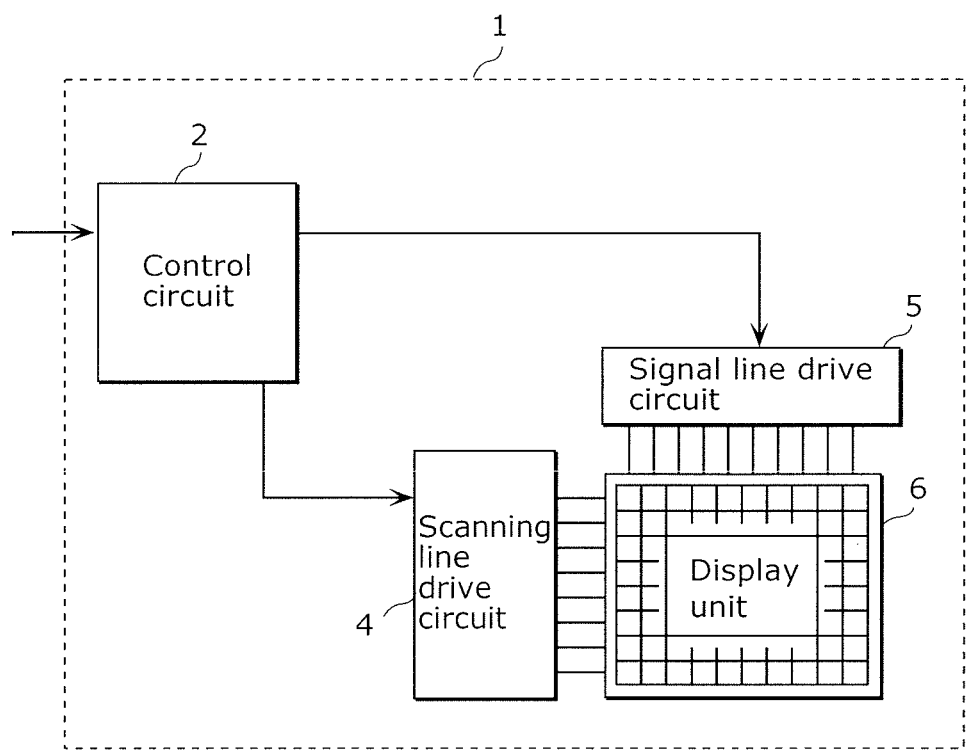
FIG. 1 is a block diagram illustrating an electrical configuration of a display device according to the present invention.

FIG. 1 is a block diagram illustrating an electrical configuration of a display device according to the present invention. A display device 1 in the figure includes a control circuit 2, a scanning line drive circuit 4, a signal line drive circuit 5, and a display unit 6.

Figure 2:
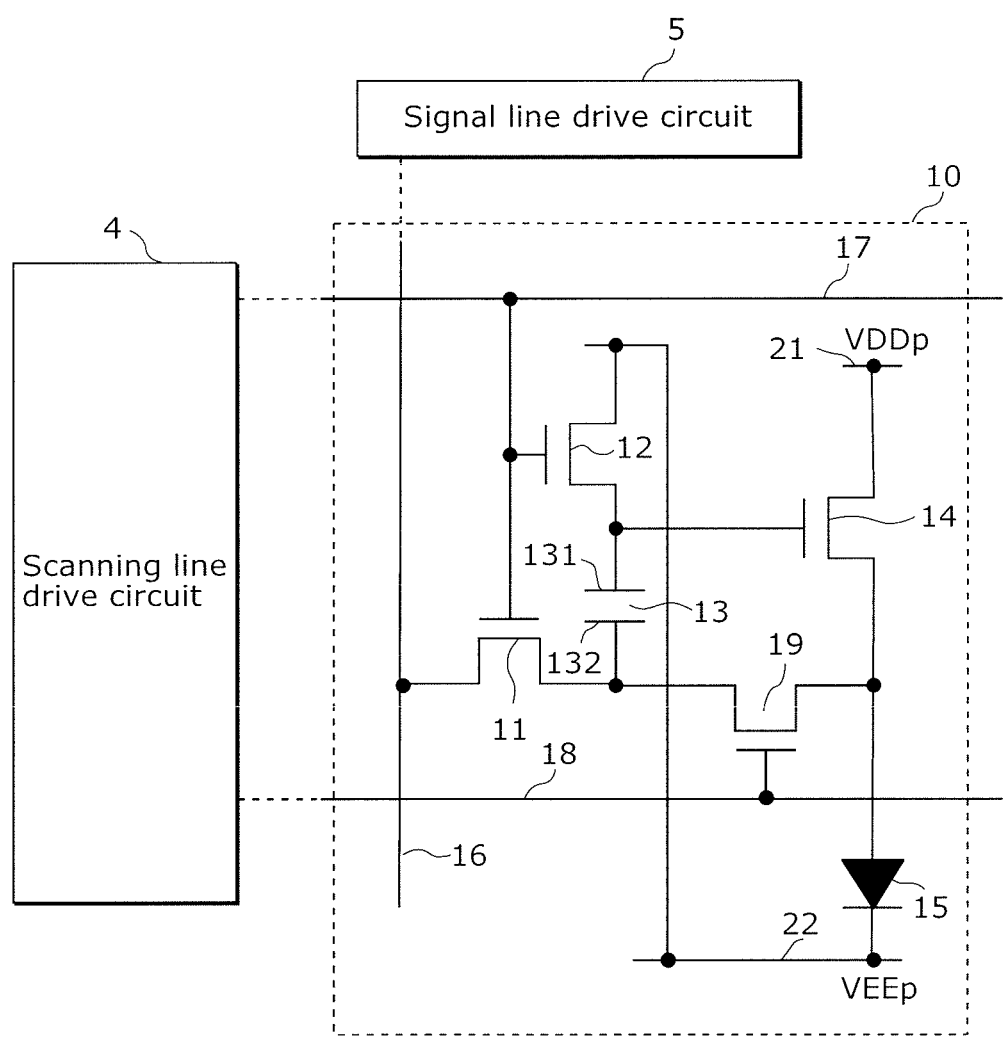
FIG. 2 is a diagram illustrating a circuit configuration of a pixel included in the display unit and a connection with peripheral circuits thereof according to an embodiment of the present invention.

Furthermore, FIG. 2 is a diagram illustrating a circuit configuration of a pixel included in the display unit and a connection with peripheral circuits thereof according to an embodiment of the present invention. A pixel 10 in the figure includes switch transistors 11, 12, and 19, an electrostatic storage capacitor 13, a drive transistor 14, an organic EL element 15, a data line 16, scanning lines 17 and 18, a positive power supply line 21, and a negative power supply line 22. Furthermore, peripheral circuits include a scanning line drive circuit 4, and a signal line drive circuit 5.

The connection relationships and functions of each structural element illustrated in FIG. 1 and FIG. 2 are described below.

The control circuit 2 outputs, to the scanning line drive circuit 4 and the signal line drive circuit 5, a control signal based on a video signal inputted from the outside.

The scanning line drive circuit 4 is connected to the scanning lines 17 and 18, and is a circuit that drives the conduction and non-conduction in the switch transistors 11, 12, and 19 included in the pixel 10 by outputting a scanning signal to the scanning lines 17 and 18.

The signal line drive circuit 5 is connected to the data line 16, and is a drive circuit that outputs, to the pixel 10, data voltage based on the video signal.

The display unit 6 includes plural pixels 10 which are arranged in a matrix, and displays an image based on the video signal inputted to the display device from the outside.

The positive power supply line 21 is a first power supply line disposed on at least a pixel row basis or a pixel column basis, and the negative power supply line 22 is a second power supply line disposed on at least a pixel row basis or a pixel column basis.

A power supply voltage is applied to the ends of the positive power supply line 21 and the negative power supply line 22 from a power supply provided outside the display unit 6. Accordingly, a voltage drop commensurate to the wire resistance of the power supply line occurs in the positive power supply line 21, from the periphery of the display panel towards the center, and a voltage rise commensurate to the wire resistance of the power supply line occurs in the negative power supply line 22, from the periphery of the display panel towards the center. In other words, a power supply line voltage VDDp, which is the voltage of the positive power supply line 21, and a power supply line voltage VEEp, which is the voltage of the negative power supply line 22, in each of the pixels 10, are different depending on the location of the voltage pixel 10 in the display unit 6.

The switch transistor 11 is a first switch element that includes a gate electrode connected to the scanning line 17 disposed on a pixel row basis, on of a source electrode and a drain electrode connected to the data line 16 disposed on a pixel column basis, and the other of the source electrode and the drain electrode connected to an electrode 132 which is a second electrode of the electrostatic storage capacitor 13. The switch transistor 11 has a function of switching between conduction and non-conduction between the electrode 132 and the data line 16 which transmits a data voltage corresponding to luminance.

The switch transistor 12 is a second switch element which includes a gate electrode connected to the scanning line 17, one of a source electrode and a drain electrode connected to the negative power supply line 22, and the other of the source electrode and the drain electrode connected to an electrode 131 which is a first electrode of the electrostatic storage capacitor 13, and is for applying a reference voltage to the electrode 131. The switch transistor 12 has a function of determining the timing for applying the power supply line voltage VEEp of the negative power supply line 22 to the electrode 131 of the electrostatic storage capacitor 13, by switching between conduction and non-conduction between the electrode 131 and the negative power supply line 22. In other words, the reference voltage of each pixel 10 is the power supply line voltage VEEp of the negative power supply line 22 of the pixel 10. The switch transistors 11 and 12 are each configured of, for example, an n-type thin film transistor (n-type TFT).

It should be noted that, by making the scanning lines of the switch transistor 11 and 12 a common scanning line 17, the number of scanning lines for controlling the switch transistors can be reduced, and thus the circuit configuration can be simplified.

The electrostatic storage capacitor 13 is a capacitive element that includes the electrode 131 connected to the gate electrode of the drive transistor 14, and the electrode 132 connected the source electrode of the drive transistor 14 via the switch transistor 19. The electrostatic storage capacitor 13 stores a voltage corresponding to the data voltage supplied from the data line 16, and, for example, stably stores the gate-source voltage of the drive transistor 14 after the switch transistors 11 and 12 are turned OFF, and thus stabilize the current supplied to the organic EL element 15 from the drive transistor 14.

The drive transistor 14 is a drive element that includes a drain electrode connected to the positive power supply line 21 and a source electrode connected to an anode electrode of the organic EL element 15. The drive transistor 14 converts the gate-source voltage into a drain current corresponding to the gate-source voltage. Subsequently, the drive transistor 14 supplies this drain current, as a single current, to the organic EL element 15. The drive transistor 14 is configured of, for example, an n-type thin film transistor (n-type TFT). In other words, the drive transistor 14 has its source electrode and drain electrode disposed in a current path between the positive power supply line 21 and the negative power supply line 22, and drives the current in the current path in accordance with the gate-source voltage.

The organic EL element 15 is a light-emitting element that includes the anode electrode and a cathode electrode which are disposed in the current path, where the cathode electrode is connected to the negative power supply line 22. The organic EL element 15 emits light according to the flow of the signal current via the drive transistor 14. The drain electrode and the source electrode of the drive transistor 14, and the anode electrode and the cathode electrode of the organic EL element 15 are disposed in the current path in this order from the positive power supply line 21.

The switch transistor 19 is a third switch element that includes a gate electrode connected to the scanning line 18 which is disposed on a pixel row basis, one of a source electrode and a drain electrode connected to the source electrode of the drive transistor 14, and the other of the source electrode and the drain electrode connected to the electrode 132 of the electrostatic storage capacitor 13. The switch transistor 19 determines the timing for applying, between the source and the gate of the drive transistor 14, the voltage stored in the electrostatic storage capacitor 13, by switching between conduction and non-conduction between the source electrode of the drive transistor 14 and the electrode 132 of the electrostatic storage capacitor 13. The switch transistor 19 is configured of, for example, an n-type thin film transistor (n-type TFT).

The data line 16 is connected to the signal line drive circuit 5 and to each of the pixels belonging to the pixel column that includes the pixel 10, and supplies a data voltage that determines light emission intensity.

Furthermore, the display device 1 includes as many of the data lines 16 as the number of pixel columns.

The scanning line 17 is connected to the scanning line drive circuit 4 and to each of the pixels belonging to the pixel row that includes the pixel 10. With this, the scanning line 17 supplies the timing for storing the data voltage in each of the pixels belonging to the pixel row that includes the pixel 10, and supplies the timing for applying the power supply line voltage VEEp to the gate electrode of the drive transistor 14 included in the pixel.

The scanning line 18 is connected to the scanning line drive circuit 4. With this, the scanning line 18 supplies the timing for applying the potential of the electrode 132 of the electrostatic storage capacitor 13 to the source electrode of the drive transistor 14.

Furthermore, the display device 1 includes as many of the scanning lines 17 and 18 as the number of pixel rows.

It should be noted that, although not illustrated in FIG. 1 and FIG. 2, each of the positive power supply line 21 and the negative power supply line 22 is connected to other pixels, and is connected to the power supply disposed in the peripheral region of the display unit 6.

(Pixel Circuit Operation)

Next, a driving operation of the display device 1 according to this embodiment will be described using FIG. 3A to FIG. 5B.

Figure 4:
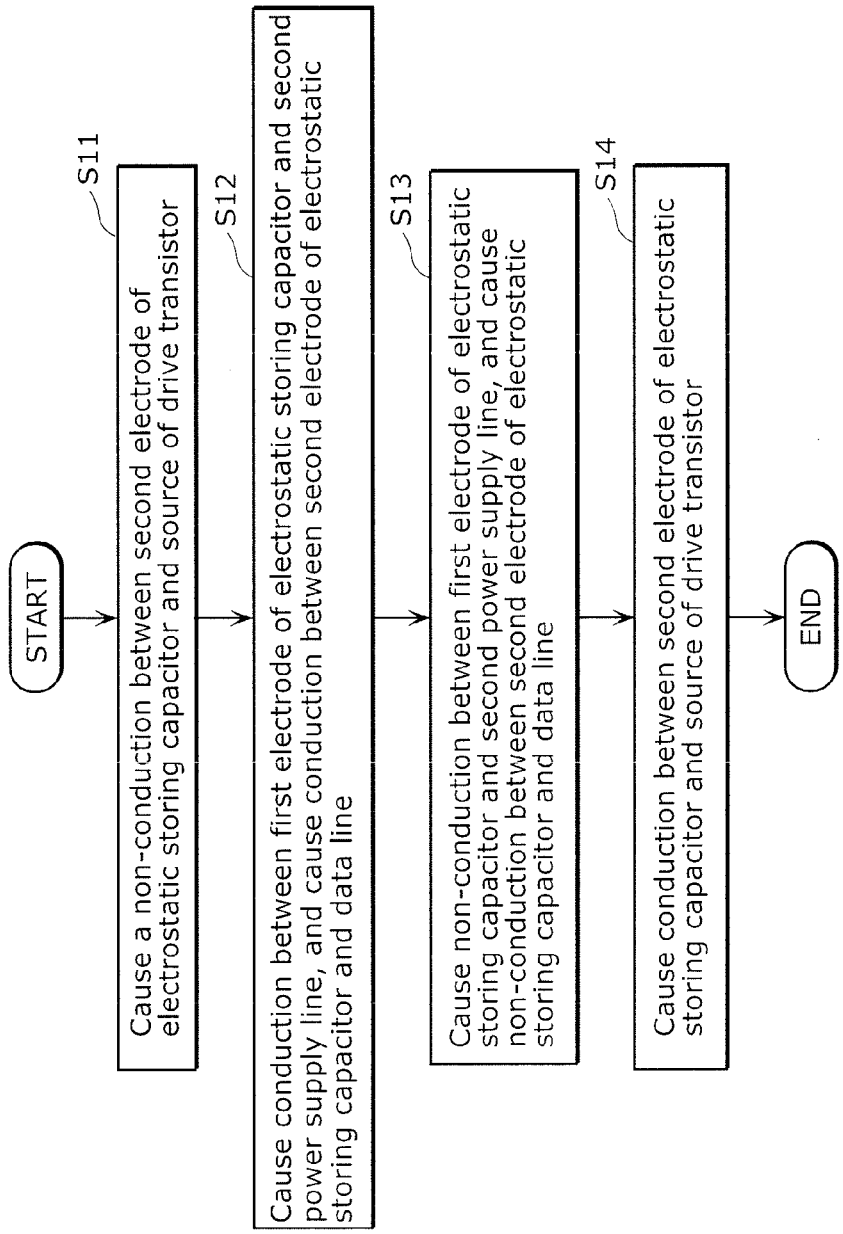
FIG. 4 is an operation flowchart for the display device according to the embodiment of the present invention.

FIG. 3A is an operation timing chart for a method of driving a display device according to Embodiment 1 of the present invention. In the figure, the horizontal axis denotes time. Furthermore, the vertical axis denotes, from top, the waveforms of voltages created in the scanning line 17, the scanning line 18, and the data line 16. Furthermore, FIG. 4 is an operation flowchart for the display device according to the Embodiment 1 of the present invention.

First, at a time t0, the scanning line drive circuit 4 causes the voltage level of the scanning line 18 to change from HIGH to LOW to turn OFF the switch transistor 19. This causes a non-conducting state between the source electrode of the drive transistor 14 and the electrode 132 (second electrode) of the electrostatic storage capacitor 13 (S11 in FIG. 4). It should be noted that in this embodiment, for example, for the voltage levels of the scanning line 18, HIGH is set to +20 V and LOW is set to −10 V.

Figure 5B:
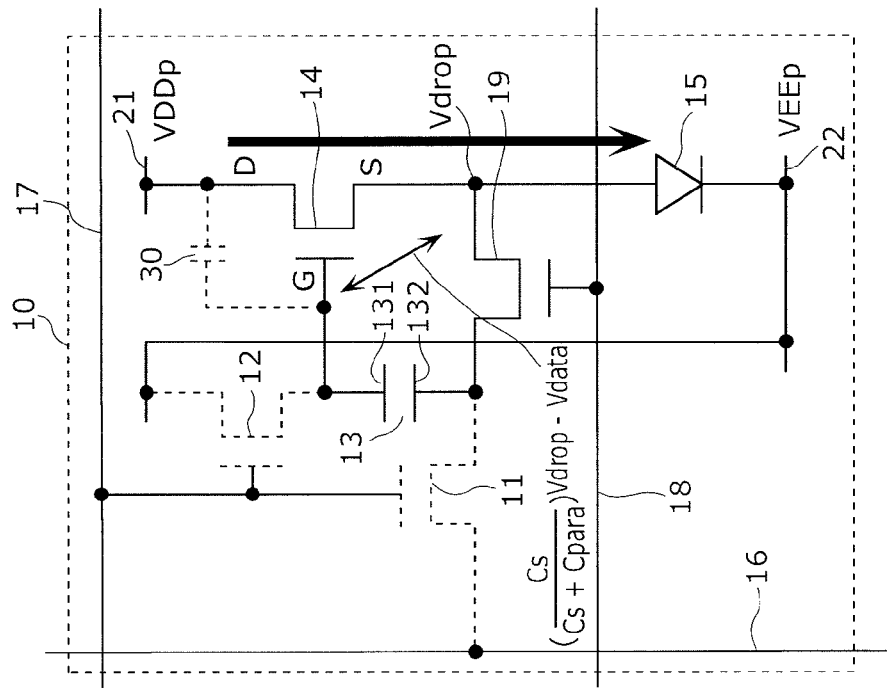
FIG. 5B is a diagram illustrating a state of conduction in a pixel circuit at the time of light emission in the display device according to the embodiment of the present invention.
Figure 5A:
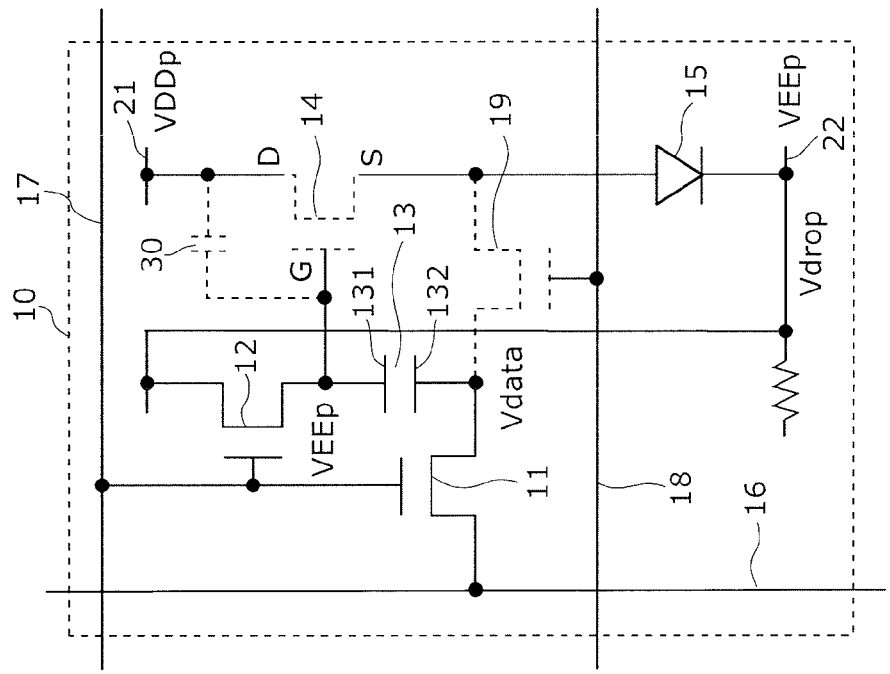
FIG. 5A is a diagram illustrating a state of conduction in a pixel circuit at the time of data voltage storing in the display device according to the embodiment of the present invention.

Next, at a time t1, the scanning line drive circuit 4 causes the voltage level of the scanning line 17 to change from LOW to HIGH to turn ON the switch transistors 11 and 12. This causes a conductive state between the electrode 131 (first electrode) and the negative power supply line 22 (second power supply), and causes a conductive state between the electrode 132 (second electrode) and the data line 16 (S12 in FIG. 4). FIG. 5A is a diagram illustrating a state of conduction in a pixel circuit at the time of data voltage storing in the display device according to Embodiment 1 of the present invention. As illustrated in the figure, the power supply line voltage VEEp of the negative power supply line 22 is applied to the electrode 131 of the electrostatic storage capacitor 13, and the data voltage Vdata is applied to the electrode 132 via the data line 16. In other words, in step S12, a charge corresponding to the data voltage to be applied to the pixel 10 is stored in the electrostatic storage capacitor 13.

Furthermore, the operation in step S11 has caused a non-conducting state between the source electrode of the drive transistor 14 and the electrode 132. In addition, although the power supply line voltage VEEp of the negative power supply line 22 is applied to the gate electrode of the drive transistor 14, at this time, a voltage, which is larger than the power supply line voltage VEEp of the negative power supply line 22 by an amount equivalent to the light emission threshold voltage of the organic EL element 15, is applied to the source electrode of the drive transistor 14, and thus a voltage less than or equal to 0 V is applied between the gate electrode and the source electrode of the drive transistor 14. Therefore, if the threshold voltage Vth of the drive transistor 14 is larger than 0 V (enhancement type), the drive transistor 14 is turned OFF. Accordingly, at this time, the drain current of the drive transistor 14 does not flow, and thus the organic EL element 15 does not emit light. It should be noted that in this embodiment, for example, for the voltage levels of the scanning line 17, HIGH is set to +20 V and LOW is set to −10 V.

In a period from the time t1 to a time t2, the voltage level of the scanning line 17 is at HIGH, and thus the data voltage Vdata is applied from the data line 16 to the electrode 132 of the pixel 10, and in the same manner, the data voltage is supplied to each of the pixels belonging to the pixel row including the pixel 10.

Here, it is assumed that a voltage drop (rise) Vdrop occurs in the negative power supply line 22 due to the wire resistance of the negative power supply line 22 and the drive current. In other words, where the negative power supply voltage is VEE, the voltage VEEp of the negative power supply line 22 is derived as shown below.

[Math. 4]

$$VEEp = VEE + Vdrop \qquad \text{(Equation 4)}$$

In this period, the potential difference generated between the drain and the source of the switch transistor 12 becomes 0 V when the charging of the electrostatic storage capacitor 13 is completed. Furthermore, the same is true for the data line 16 and the switch transistor 11. Therefore, an accurate voltage Vdata corresponding to the data voltage, and a voltage (VEE+Vdrop) obtained by adding the voltage drop (rise) Vdrop to the negative power supply voltage VEE, are respectively applied to the electrode 131 and the electrode 132 of the electrostatic storage capacitor 113. Therefore, the voltage (VEE+Vdrop−Vdata) is stored in the electrostatic storage capacitor 13.

Next, at the time t2, the scanning line drive circuit 4 causes the voltage level of the scanning line 17 to change from HIGH to LOW to turn OFF the switch transistors 11 and 12. This causes a non-conducting state between the electrode 131 (first electrode) and the negative power supply line 22 (second power supply line), and causes a non-conducting state between the electrode 132 (second electrode) and the data line 16 (S13 in FIG. 4).

Next, at a time t3, the scanning line drive circuit 4 causes the voltage level of the scanning line 18 to change from LOW to HIGH to turn ON the switch transistor 19. FIG. 5B is a diagram illustrating a state of conduction in a pixel circuit at the time of light emission in the display device according to Embodiment 1 of the present invention. As illustrated in the figure, the source electrode of the drive transistor 14 and the electrode 132 (second electrode) of the electrostatic storage capacitor 13 are in a conducting state (S14 in FIG. 4). Furthermore, the electrode 131 of the electrostatic storage capacitor 13 is electrically cut off from the negative power supply line 22, and the electrode 132 is electrically cut off from the data line 16. Therefore, the gate potential of the drive transistor 14 changes together with the change of the source potential, and (VEEp−Vdata), which is the voltage across the electrostatic storage capacitor 13 is applied between the gate and the source.

Due to the flow of drive current to the organic EL element 15, with the potential of the negative power supply line 22 being in the state indicated in Equation 4, the source potential of the drive transistor 14 also rises, together with the potential of the negative power supply line 22, by an amount equivalent to Vdrop, as compared to the state in which there is no voltage drop (normally, source potential=the negative power supply line voltage VEEp+anode-cathode voltage of the organic EL element 15. However, due to the voltage drop Vdrop, the source potential rises above than the normal source potential by the amount of the Vdrop). At this time, the gate electrode of the drive transistor 14 is in a floating state, and thus the gate potential rises in accordance with the change of the source potential. Here, a parasitic capacitance 30 is present between the gate and the drain of the drive transistor 14, and the capacitance value of the parasitic capacitor 30 is assumed to be Cpara. In this case, a change in the gate potential ΔVg of the drive transistor 14 is {Vdrop×Cs/(Cs+Cpara)} with respect to the change in the source potential Vdrop. It should be noted that Cs is the capacitance value of the electrostatic storage capacitor 13. Therefore, the gate-source voltage Vgs of the drive transistor 14 is derived from the voltage (VEEp−Vdata) stored in the electrostatic storage capacitor 13, the change in the gate voltage ΔVg, and the change in the source voltage ΔVs, as shown below.

[Math. 5]

$$Vgs = (VEEp - Vdata) + \Delta Vg - \Delta Vs \quad \text{(Equation 5)}$$

$$= (Vdrop - Vdata) + \left(\frac{Cs}{Cs + Cpara}\right) Vdrop - Vdrop$$

$$= \left(\frac{Cs}{Cs + Cpara}\right) Vdrop - Vdata$$

The Vgs at the start of light emission changes from the stored voltage (VEEp−Vdata) to that shown in Equation 5 above, due to the voltage drop (rise) in the negative power supply line 22. Assuming that the accurate stored voltage is, for example, −Vdata (in the case where VEE=GND (0V)), the change in the Vgs ΔVgs from the accurate stored voltage is as shown below.

[Math. 6]

$$\Delta Vgs = \left(\frac{Cs}{Cs + Cpara}\right) Vdrop \quad \text{(Equation 6)}$$

In other words, compared to the above-mentioned accurate stored voltage, Vgs at the start of light emission is larger by the ΔVgs expressed in Equation 6 above. Furthermore, the larger the voltage drop (rise) Vdrop in the negative power supply line 22 is, the larger ΔVgs becomes. Furthermore, a drive current flowing in the organic EL element 15 is expressed as follows:

[Math. 7]

$$Id = \beta(Vgs - Vth)^2 \quad \text{(Equation 7)}$$

$$= \beta\left[\left(\frac{Cs}{Cs + Cpara}\right) Vdrop - Vdata - Vth\right]^2$$

Here β and Vth are, respectively, the mobility and threshold voltage of the drive transistor 14. According to Equation 7 above, the drive current Id also increases, and the light emission luminance of the organic EL element 15 increases as a result. Furthermore, the larger the voltage drop (rise) Vdrop is, the more the light emission luminance of the organic EL element 15 increases. Normally, the power supply that supplies voltage to the positive power supply line 21 and the negative power supply line 22 is disposed outside of the display unit 6, and power supply voltage is supplied from the power supply to the power supply line located at the outermost periphery of the display unit 6. In this case, the potential of the positive power supply line 21 drops with proximity to the center of the display unit 6, and the potential of the negative power supply line 22 rises with proximity to the center of the display unit 6. In other words, the potential difference between the positive power supply line 21 and the negative power supply line 22 decreases with proximity to the center of the display unit 6. Therefore, the screen central portion, where voltage drop (rise) is larger (the potential difference is smaller), becomes brighter.

It should be noted that, in the present embodiment, for example, the source potential of the drive transistor 14 changes from 0 V to 10 V due to the conduction in the switch transistor 19. Furthermore, the voltage VDD of the positive power source line is set to +20 V, and the power supply line voltage VEE of the negative power supply line 22 is set to 0 V.

Figure 6:
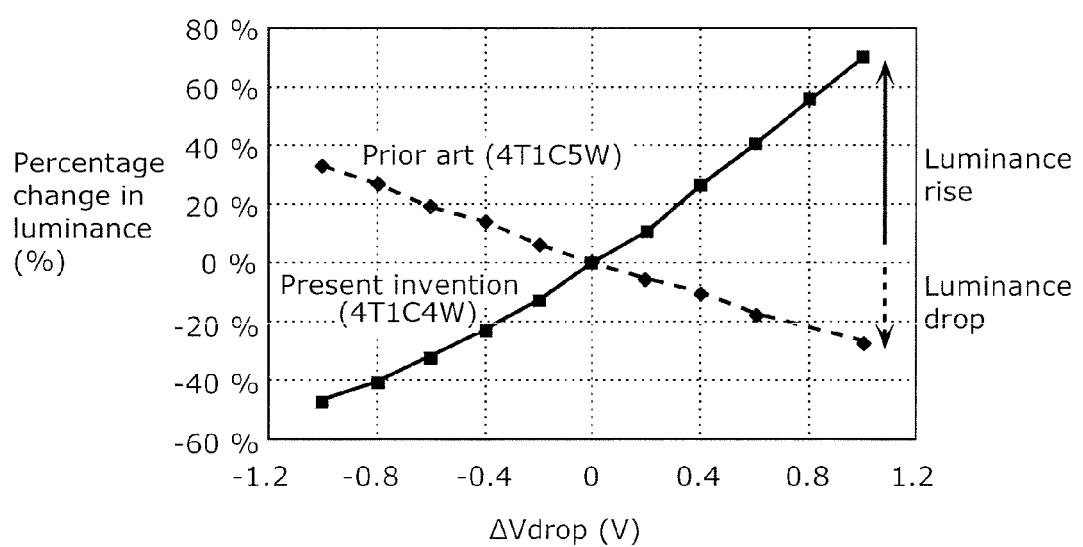
FIG. 6 is a graph comparing luminance of the display device according to the embodiment of the present invention and a conventional display device.

FIG. 6 is a graph comparing the luminance of the display device according to this embodiment and a conventional display device. In the graph illustrated in the figure, the horizontal axis denotes ΔVdrop which is the amount of voltage drop (rise) in the negative power supply line 22, and the vertical axis denotes the percentage change in luminance when luminance in the case where there is no voltage drop (rise) in the negative power supply line 22 is set as the reference luminance. Furthermore, in the figure, the percentage change in luminance of the display device 1 (4T1C4W) according to this embodiment and a conventional image display device (4T1C5W) are compared. Here, 4T1C4W represents, for example: the four transistors, namely, the drive transistor 14 and the switch transistors 11, 12, and 19 as 4T; the electrostatic storage capacitor 13 as 1C; and the four lines, namely, the positive power supply line 21, the data line 16, and the scanning lines 17 and 18 as 4W. Furthermore, 4T1C5W represents, for example the four transistors, namely, the drive transistor 514 and the switch transistors 511, 512, and 519 as 4T, the electrostatic storage capacitor 513 as 1C, and the five lines, namely, the positive power supply line 521, the data line 516, the scanning lines 517 and 518, and the reference power supply line 520.

In FIG. 6, in the conventional image display device, the percentage change in luminance decreases as ΔVdrop increases. This shows the voltage drop (rise) amount dependency of the drive current Id based on Equation 3, and shows that luminance drop is larger with proximity to the screen central portion where the amount of voltage drop (rise) is large. In contrast, in the display device 1 according to the present invention, the percentage change in luminance increases as ΔVdrop increases. This shows the voltage drop (rise) amount dependency of the drive current Id based on Equation 7, and shows that luminance rises with proximity to the screen central portion where the amount of voltage drop (rise) is large. In other words, the display device 1 according to the present invention reverses the tendency for luminance change in the conventional image display device.

In the period from the time t3 to a time t4, the voltage Vgs expressed in Equation 5 is continuously applied between the gate and the source, and the current Id expressed in Equation 7 flows, thus causing the organic EL element 15 to continue to emit light.

The period from t0 to t4 corresponds to a 1-frame period in which the light emission intensity of all the pixels included in the display device 1 is updated, and the operations in the period t0 to t4 are also repeated after t4.

FIG. 3B is an operation timing chart illustrating a modification of the method of driving the display device according to Embodiment 1 of the present invention.

First, at a time t10, the scanning line drive circuit 4 simultaneously executes the operation at the time t0 in FIG. 3A and the operation at the time t1 in FIG. 3A (S11 and S12 in FIG. 4). In other words, the source electrode of the drive transistor 14 and the electrode 132 are in a non-conducting state, and, at the same time, the power supply line voltage VEEp is applied to the electrode 133 and the data voltage Vdata is applied to the electrode 132.

In the period from a time t10 to a time t11, the same state as that in the period from the time t1 to the time t2 in FIG. 3A is realized. Since the voltage level of the scanning line 17 is at HIGH, the data voltage Vdata is applied from the data line 16 to the electrode 132 of the pixel 10, and in the same manner, the data voltage is supplied to each of the pixels belonging to the pixel row including the pixel 10.

In this period, the potential difference occurring between the drain electrode and the source electrode of the switch transistor 12 becomes 0 V when the charging of the electrostatic storage capacitor 13 is completed. The same is true for the data line 16 and the switch transistor 11. Therefore, an accurate voltage Vdata corresponding to the data voltage, and a voltage (VEE+Vdrop) obtained by adding the voltage drop (rise) Vdrop to the negative power line voltage VEE are respectively applied to the electrode 131 and the electrode 132. Therefore, the voltage (VEE+Vdrop−Vdata) is stored in the electrostatic storage capacitor 13.

Next, at the time t11, the scanning line drive circuit 4 simultaneously executes the operation at the time t2 in FIG. 3A and the operation at the time t3 in FIG. 3A (S13 and S14 in FIG. 4). In other words, the electrode 131 and the negative power supply line 22 are in a non-conducting state, the electrode 132 and the data line 16 are in a non-conducting state, and the source electrode of the drive transistor 14 and the electrode 132 are in a conducting state. At this time, Vgs changes from the stored voltage (VEEp−Vdata) to that shown in Equation 5 above, due to the voltage drop (rise) in the negative power supply line 22.

In the period from the time t11 to a time t12, the Vgs expressed in Equation 5 is continuously applied between the gate and the source, and the current Id expressed in Equation 7 flows, thus causing the organic EL element 15 to continue to emit light.

The period from t10 to t12 corresponds to a 1-frame period in which the light emission intensity of all the pixels of the display device 1 are updated, and the operations in the period from t10 to t12 are also repeated after t12.

As described above, according to the display device according to this embodiment of the present invention, at the time of data voltage storing, the data voltage Vdata is applied, via the switch transistor 11, to the electrode 132 that is connectable with the source electrode of the drive transistor 14, and the power supply line voltage VEEp of the negative power supply line 22, in which a voltage drop (rise) occurs, is applied to the electrode 131 that is connectable with the gate electrode of the drive transistor 14. Accordingly, since a voltage, which is obtained by adding the absolute value of the amount of voltage drop (rise) Vdrop in the power supply line to the absolute value of the data voltage Vdata, is stored in the electrostatic storage capacitor 13, and a voltage, which is obtained by adding a voltage corresponding to the amount of voltage drop (rise) to a voltage corresponding to the data voltage Vdata, is applied between the gate and the source of the drive transistor 14 at the start of light emission, the light emission luminance at the screen central portion, where the amount of voltage drop (rise) is larger than at the screen peripheral portion, becomes relatively higher. Therefore, in the display device 1 according to Embodiment 1 of the present invention, the screen central portion becomes brighter than the screen peripheral portion, and thus high picture quality can be provided.

It should be noted that in the operation timing illustrated in FIG. 3A, by controlling the timing for the scanning line 18 at the time t3 and the time t4 independently of the timing for the scanning line 17, the light emission time in a 1-frame period, that is, duty control, can be adjusted arbitrarily. On the other hand, in the operation timing illustrated in FIG. 3B, the scanning lines 17 and 18 operate at the same time. Therefore, the circuit size can be reduced to simplify the scanning line drive circuit, and the number of outputs of the scanning line drive circuit 4 can be reduced by making the scanning lines 17 and 18 into a single line in the case where the switch transistor 11 and the switch transistor 12 are of the n (p) type and the switch transistor 19 is of the p (n) type. Here, although the aforementioned duty control is not possible, approximately 100% light emission is maintained in a 1-frame period except in the data voltage storing period.

(Pixel Layout)

Next, a layout of circuit elements for realizing the circuit configuration of the pixel 10 included in the display device according to this embodiment will be described.

Figure 7:
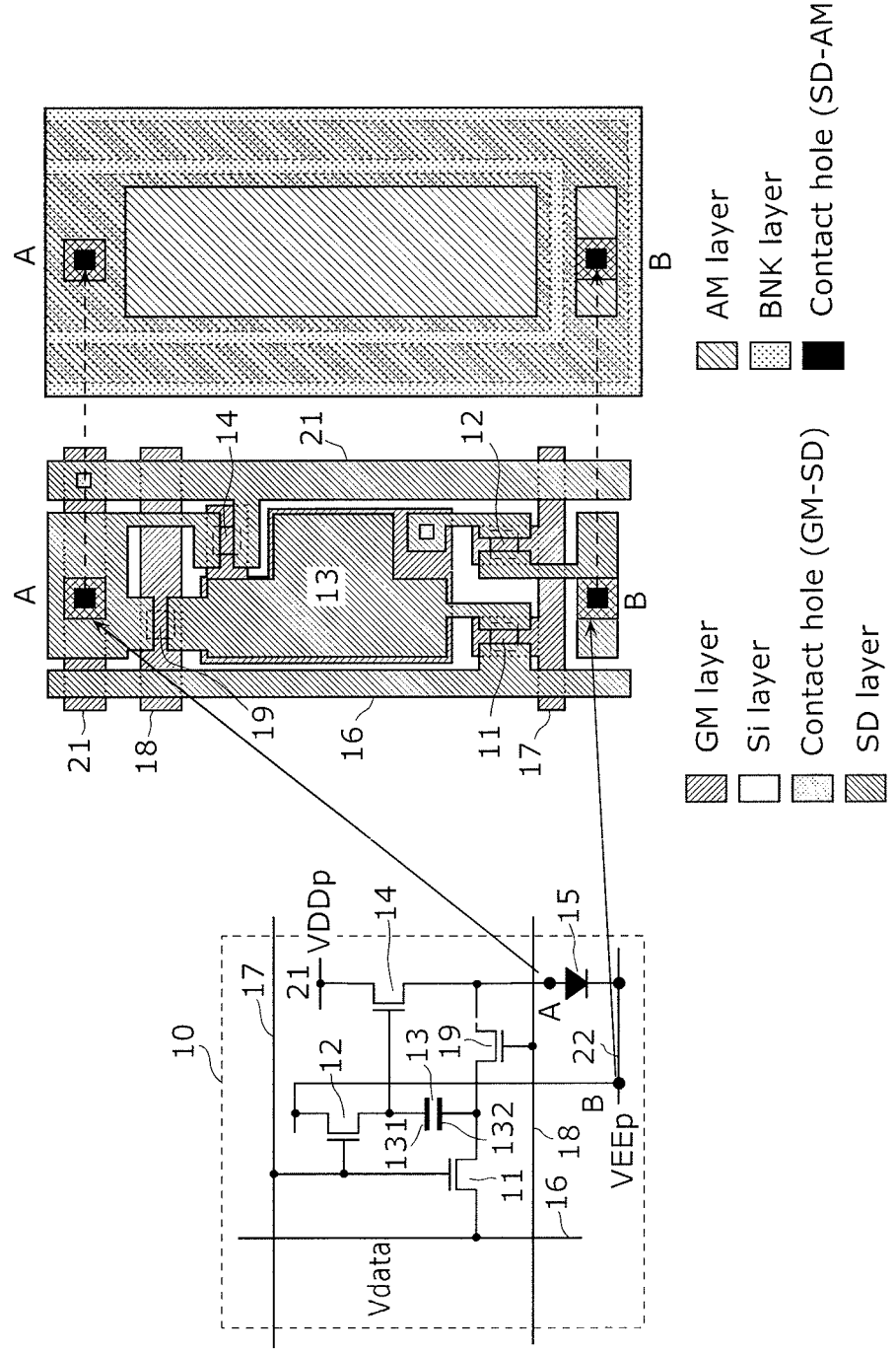
FIG. 7 is a circuit layout diagram of a pixel according to the embodiment of the present invention.

FIG. 7 is a circuit layout diagram of a pixel according to this embodiment of the present invention. In the figure, a circuit diagram of the pixel 10 is illustrated on the left side, a perspective view from the top of a drive circuit layer is illustrated at the center, and a perspective view from the top of a light-emitting layer is illustrated on the right side. Since FIG. 7 illustrates a top emission-type circuit layout diagram, the positional relationship is such that the drive circuit layer is in a lower layer and the light-emitting layer is in an upper layer.

The drive circuit layer that includes the circuit elements of the pixel 10 other than the organic EL element 15 and the negative power supply line 22 includes a GM (gate metal) layer, an SD (source/drain) layer, and an Si (semiconductor) layer. Each of the drive transistor 14, the switch transistors 11, 12, and 19 is configured of bottom-gate electrode thin-film transistor. Therefore, the GM layer becomes the lower layer, the SD layer becomes the upper layer, and the Si layer becomes the intermediate layer. The gate electrode of the respective transistors, the electrode 131 of the electrostatic storage capacitor 13, the scanning lines 17 and 18, and the positive power supply line 21 (horizontal direction in the figure) are disposed in the GM layer. Furthermore, the source electrode and the drain electrode of the respective transistors, the electrode 132 of the electrostatic storage capacitor 13, the data line 16, and the positive power supply line 21 (vertical direction in the figure) are disposed in the SD layer.

On the other hand, the light-emitting layer that includes the organic EL element 15 and the negative power supply line 22 of the pixel 10 includes an AM (anode metal) layer, a BNK (bank) layer, and a transparent cathode layer (not illustrated). Here, the AM layer becomes the lower layer, the BNK becomes the intermediate layer, and the transparent cathode layer becomes the upper layer. The anode electrode of the organic EL element is disposed in the AM layer, the negative power supply line 22 and the cathode electrode of the organic EL element are disposed in the transparent cathode layer. It should be noted that, in this example, the negative power supply line 22 is not a line provided to each of the pixels, but is configured of a transparent cathode film formed throughout the entirety of the display unit 6. The negative power supply line 22 is homologous with the cathode electrode of the organic EL element 15, and the cathode electrode is a common electrode formed in common for all the pixels 10. Banks for partitioning the organic light-emitting layer on a pixel basis are formed in the BNK layer.

Here, in order to realize the circuit of the pixel 10, the drive circuit layer and the light-emitting layer are electrically connected via a connection point A between the anode electrode of the organic EL element 15 and the source electrode of the drive transistor 14. The connection point A is configured of a contact hole that connects the SD layer and the AM layer. Furthermore, an essential part of the present invention, namely, a connection point B between the negative power supply line 22 and one of the source electrode and the drain electrode of the switch transistor 12 is configured of a contact hole that connects the SD layer and the transparent cathode layer. More precisely, the SD layer and the transparent cathode layer are connected by way of the transparent cathode layer, the AM layer (the region without banks), the contact hole connecting the AM layer and the SD layer, and the connection point B.

With the above-described layout, the circuit of the pixel 10 according to the present invention is realized.

In the above-described layout, the connection point B is disposed on a pixel basis. With this, the light emission luminance of the pixels 10 can be precisely changed in accordance with the pixel location in the display unit 6. On the other hand, since the connection point B is connected to the transparent cathode which is the uppermost layer, the pixel opening which becomes the light-emitting region becomes restricted. In response to this, a layout for suppressing the deterioration of pixel aperture ratio will be described.

Figure 8:
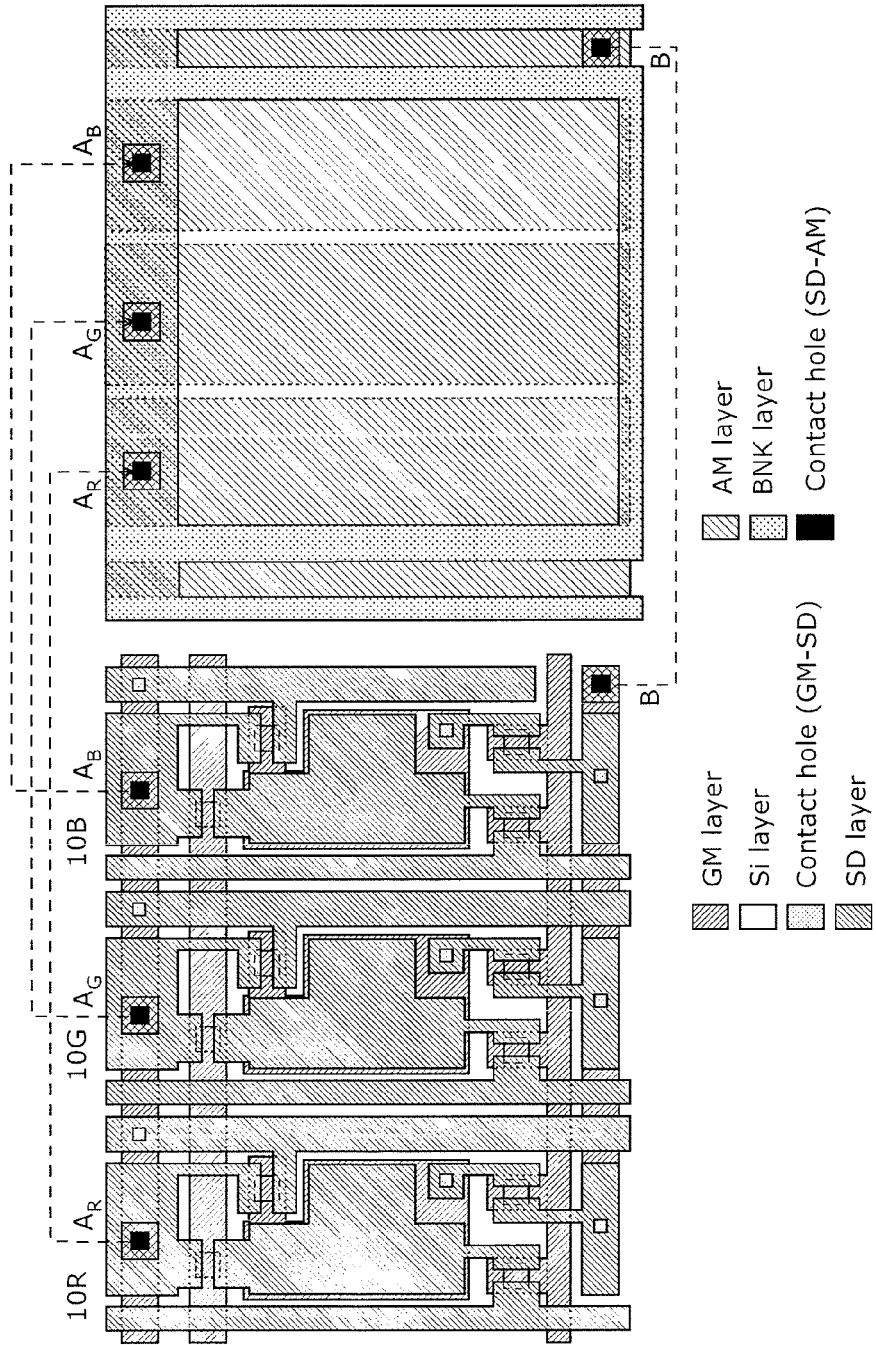
FIG. 8 is a circuit layout diagram illustrating a modification of the pixel according to the embodiment of the present invention.

FIG. 8 is a circuit layout diagram illustrating a modification of the pixel according to this embodiment of the present invention. The circuit layout illustrated in the figure is different compared to the circuit layout illustrated in FIG. 7 in that the connection point B connecting the negative power supply line 22 and the one of the source electrode and the drain electrode of the switch transistor 12 is not disposed on a pixel basis. In the drive circuit layer layout illustrated on the left side in FIG. 8, for example, a red pixel 10R, a green pixel 10G, and a blue pixel 10B which lie side-by-side make up one unit pixel, and a contact hole which forms the connection point B is provided on a unit pixel basis. In other words, the connection point B provided in common to two or more adjacent pixels. Since a big difference in the amount of voltage drop (rise) cannot be seen among adjacent pixels, the advantageous effect of the present invention of the screen central portion being brighter than the screen peripheral portion is achieved even with a configuration in which the connection point B is provided on a unit pixel basis as described above. Furthermore, according to the layout configuration of this modification, the deterioration of the aperture ratio caused by the contact hole is suppressed.

As represented by the above-described layout illustrated in FIG. 7 and FIG. 8, the pixel interval at which the connection point B is provided can be determined in accordance with the degree of potential change of the aforementioned common electrode.

It should be noted that the negative power supply line 22 which is the common electrode may be formed from a conductive metal oxide. Furthermore, in this case, it is preferable that the negative power supply line 22 be formed from a material having a sheet resistance greater than or equal to 1 Ω/sq. Compared to a highly conductive metal electrode, the common electrode comprising a metal oxide has a high resistance. With this, the change in the amount of voltage drop (rise) of the common electrode, which is in accordance with the location of the common electrode inside the display unit, is larger than the change in the amount of voltage drop (rise) of a metal electrode. Therefore, it is possible to set a significant change in the light emission luminance which is in accordance with the location in the display unit.

It should be noted that the circuit configuration of the pixels included in the display device 1 according to the present invention is not limited to the circuit configuration illustrated in FIG. 2. Examples of pixel circuit configurations for the display device according to the present invention.

(Modification 1 of a Pixel Circuit Configuration, which Includes n-Type Drive Transistors)

Figure 9C:
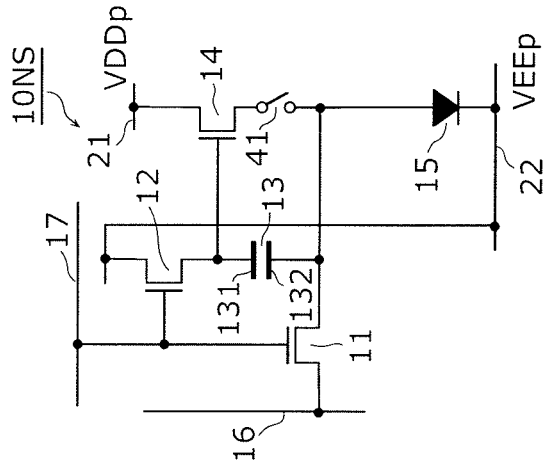
FIG. 9C is a circuit diagram illustrating a third modification of the pixel circuit according to the embodiment of the present invention.
Figure 9B:
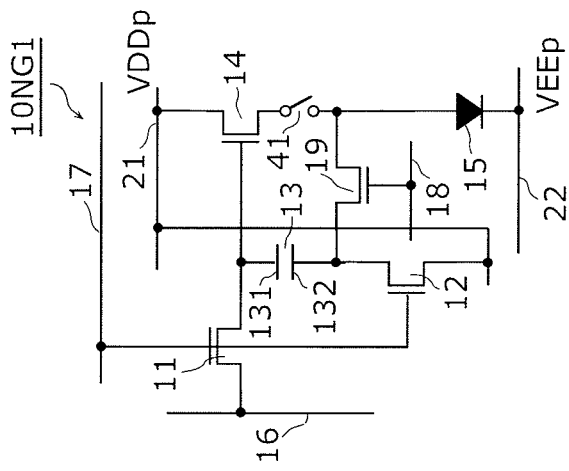
FIG. 9B is a circuit diagram illustrating a second modification of the pixel circuit according to the embodiment of the present invention.
Figure 9A:
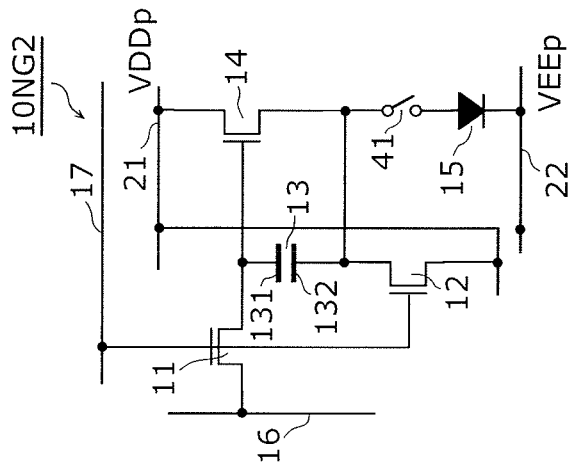
FIG. 9A is a circuit diagram illustrating a first modification of the pixel circuit according to the embodiment of the present invention.

FIG. 9A is a circuit diagram illustrating a first modification of the pixel circuit according to this embodiment of the present invention. The circuit configuration of a pixel 10NS illustrated in the figure is different compared to the circuit configuration of the pixel 10 illustrated in FIG. 2 only in the point that a switch element 41 is provided in place of the switch transistor 19 and the scanning line 18. Hereinafter, description will be carried out centering on the difference from the circuit configuration of the pixel 10 illustrated in FIG. 2.

The switch element 41 has one end connected to the source electrode of the drive transistor 14 and the other end connected to the electrode 132 and the anode electrode of the organic EL element 15, and has a function of allowing or cutting off the flow of the drive current from the drive transistor 14. The switch element 41 is configured of, for example, a thin-film transistor having a gate electrode connected to the scanning line 18. The drive timing of the switch element 41 is the same as that of the switch transistor 19 in the pixel 10 illustrated in FIG. 2. With the above-described circuit configuration and drive timing, a display device in which pixels 10NS are arranged in a matrix produces the same advantageous effect as the display device 1 according to the foregoing embodiment.

(Modification 2 of a Pixel Circuit Configuration, which Includes n-Type Drive Transistors)

FIG. 9B is a circuit diagram illustrating a second modification of the pixel circuit according to this embodiment of the present invention. A circuit configuration of a pixel 10NG1 illustrated in the figure includes the switch transistors 11, 12, and 19, the electrostatic storage capacitor 13, the drive transistor 14, the organic EL element 15, the data line 16, the scanning lines 17 and 18, the positive power supply line 21, the negative power supply line 22, and the switch element 41.

Here, the switch transistor 11 is a first switch element that includes a gate electrode connected to the scanning line 17, one of a source electrode and a drain electrode connected to the data line 16, and the other of the source electrode and the drain electrode connected to the electrode 131 (first electrode) of the electrostatic storage capacitor 13. The switch transistor 11 has a function of determining the timing for applying the data voltage of the data line 16 to the electrode 131, by switching between conduction and non-conduction between the electrode 131 and the data line 16.

Here, the switch transistor 12 is a second switch element that includes a gate electrode connected to the scanning line 17, one of a source electrode and a drain electrode connected to positive power supply line 21 (first power supply line), and the other of the source electrode and the drain electrode connected to the electrode 132 (second electrode) of the electrostatic storage capacitor 13. The switch transistor 12 has a function of determining the timing for applying the power supply line voltage VDDp of the positive power supply line 21 in the pixel 10NG1 to the electrode 132, by switching between conduction and non-conduction between the electrode 132 and the positive power supply line 21. The switch transistors 11 and 12 are each configured of, for example, an n-type thin film transistor (n-type TFT).

Here, the electrostatic storage capacitor 13 is a capacitive element that includes the electrode 131 connected to the gate electrode of the drive transistor 14, and the electrode 132 connected the anode electrode of the organic EL element 15 via the switch transistor 19. The electrostatic storage capacitor 13 stores a voltage corresponding to the data voltage supplied from the data line 16, and, for example, stably stores the gate-source voltage of the drive transistor 14 after the switch transistors 11 and 12 are turned OFF, and thus stabilize the current supplied to the organic EL element 15 from the drive transistor 14.

The drive transistor 14 is a drive element that includes a drain electrode connected to the positive power supply line 21 and a source electrode connected to one end of the switch element 41. The drive transistor 14 converts the gate-source voltage into a drain current corresponding to the gate-source voltage. Subsequently, the drive transistor 14 supplies this drain current, as a single current, to the organic EL element 15. The drive transistor 14 is configured of, for example, an n-type thin film transistor (n-type TFT).

Here, the organic EL element 15 is a light-emitting element including a cathode connected to the negative power supply line 22, and emits light according to the flow of the signal current via the drive transistor 14 and the switch element 41. The drain electrode and the source electrode of the drive transistor 14, and the anode electrode and the cathode electrode of the organic EL element 15 are disposed in this order in the current path between the positive power supply line 21 and the negative power supply line 22.

Here, the switch transistor 19 is a third switch element that includes a gate electrode connected to the scanning line 18, one of a source electrode and a drain electrode connected to the anode electrode of the organic EL element 15, and the other of the source electrode and the drain electrode connected to the electrode 132 of the electrostatic storage capacitor 13. The switch transistor 19, in conjunction with the switch element 41, determines the timing for applying the voltage stored in the electrostatic storage capacitor 13 between the gate and the source of the drive transistor 14. The switch transistor 19 is configured of, for example, an n-type thin film transistor (n-type TFT).

Here, the switch element 41 has the other end connected to one of the source electrode and the drain electrode of the switch transistor 19 and the anode electrode of the organic EL element 15, and has a function of allowing or cutting off the flow of the drive current from the drive transistor 14. The switch element 41 is configured of, for example, a thin-film transistor having a gate electrode connected to a scanning line. In this circuit configuration, the switch element 41 is provided to prevent the drive current from flowing to the organic EL element 15 and causing light emission when the drive transistor 14 is turned ON by the application of the data voltage Vdata to the gate electrode of the drive transistor 14 at the time of data voltage storing. On the other hand, the switch transistor 19 is provided to prevent current from flowing to the organic EL element 15 through a path from the positive power supply line 21 to the switch transistor 12 to the electrode 132 to the switch transistor 19 to the organic EL element 15 to the negative power supply line 22, at the time of data voltage storing. Therefore, the drive timing of the switch element 41 is the same as the drive timing of the switch transistor 19.

As described above, according to this modification, at the time of data voltage storing, the data voltage Vdata is applied, via the switch transistor 11, to the electrode 131 that is connectable with the gate electrode of the drive transistor 14, and the power supply line voltage VDDp of the positive power supply line 21, in which a voltage drop occurs, is applied to the electrode 132 that is connectable with the source electrode of the drive transistor 14. Accordingly, since a voltage, which is obtained by adding the absolute value of the amount of voltage drop in the power supply line to the absolute value of the data voltage Vdata, is stored in the electrostatic storage capacitor 13, the light emission luminance at the screen central portion, where the amount of voltage drop is larger than at the screen peripheral portion, becomes relatively higher. Therefore, with a display device in which pixels 10NG1 according to this modification are arranged in a matrix, the screen central portion becomes brighter than the screen peripheral portion, and thus high picture quality can be provided.

(Modification 3 of a Pixel Circuit Configuration, which Includes n-Type Drive Transistors)

FIG. 9C is a circuit diagram illustrating a third modification of the pixel circuit according to this embodiment of the present invention. The circuit configuration of a pixel 10NG2 illustrated in the figure is different compared to the circuit configuration of the pixel 10NG1 illustrated in FIG. 9B in that the switch transistor 10 and the scanning line 18 are not present, and the connection position of the switch element 41 is different. Hereinafter, description will be carried out focusing on the difference from the circuit configuration of the pixel 10NG1 illustrated in FIG. 9B.

Here, the switch element 41 has one end connected to the source electrode of the drive transistor 14 and the electrode 132 of the electrostatic storage capacitor 13, and the other end connected to the anode electrode of the organic EL element 15. The switch element 41, by switching to the non-conducting state at the time of data voltage storing, has a function of cutting off the current path from the positive power supply line 21 to the drive transistor 14 to the switch element 41 to the organic EL element 15 to the negative power supply line 22, and the current path from the positive power supply line 21 to the switch transistor 12 to the electrode 132 to the switch element 41 to the organic EL element 15 to the negative power supply line 22. Accordingly, since the current paths are cut off even if the electrostatic storage capacitor 13 and the drive transistor 14 are connected at the time of data voltage storing, a voltage corresponding to the data voltage is stored in the electrostatic storage capacitor 13. The drive timing of the switch element 41 is the same as that of the switch transistor 19 illustrated in FIG. 2. With the above-described circuit configuration and drive timing, a display device in which pixels 10NG2 are arranged in a matrix produces the same advantageous effect as the display device 1 according to the foregoing embodiment. It should be noted that due to the switch element 41 being disposed in the above described position, the switch transistor 19 is rendered unnecessary.

(Modification 4 of a Pixel Circuit Configuration, which Includes p-Type Drive Transistors)

Figure 10A:
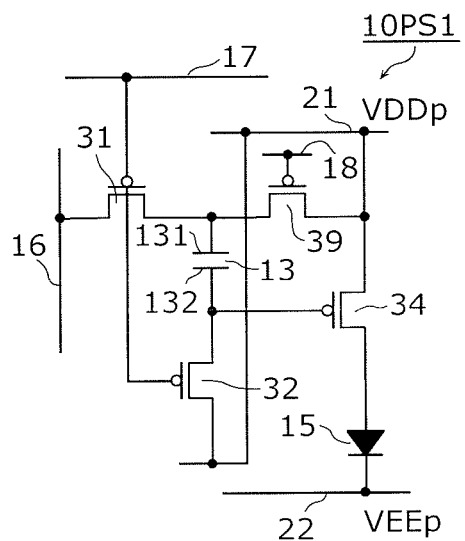
FIG. 10A is a circuit diagram illustrating a fourth modification of the pixel circuit according to the embodiment of the present invention.

FIG. 10A is a circuit diagram illustrating a fourth modification of the pixel circuit according to this embodiment of the present invention. A circuit configuration of a pixel 10PS1 illustrated in the figure includes p-type switch transistors 31, 32, and 39, the electrostatic storage capacitor 13, a drive transistor 34, the organic EL element 15, the data line 16, the scanning lines 17 and 18, the positive power supply line 21, the negative power supply line 22.

The switch transistor 31 is a first switch element that includes a gate electrode connected to the scanning line 17, one of a source electrode and a drain electrode connected to the data line 16, and the other of the source electrode and the drain electrode connected to the electrode 131 of the electrostatic storage capacitor 13. The switch transistor 31 has a function of determining the timing for applying the data voltage of the data line 16 to the electrode 131, by switching between conduction and non-conduction between the electrode 131 (second electrode) of the electrostatic storage capacitor 13 and the data line 16.

The switch transistor 32 is a second switch element that includes a gate electrode connected to the scanning line 17, one of a source electrode and a drain electrode connected to the positive power supply line 21, and the other of the source electrode and the drain electrode connected to the electrode 132 of the electrostatic storage capacitor 13. The switch transistor 32 has a function of determining the timing for applying the power supply line voltage VDDp of the positive power supply line 21 to the electrode 132, by switching between conduction and non-conduction between the electrode 132 (first electrode) of the electrostatic storage capacitor 13 and the positive power supply line 21. The switch transistors 31 and 32 are each configured of, for example, a p-type thin film transistor (p-type TFT).

Here, the electrostatic storage capacitor 13 is a capacitive element that includes the electrode 131 connected to the source electrode of the drive transistor 34 and the positive power supply line 21 via the switch transistor 39, and the electrode 132 connected to the gate electrode of the drive transistor 34. The electrostatic storage capacitor 13 stores a voltage corresponding to the data voltage supplied from the data line 16, and, for example, stably stores the gate-source voltage of the drive transistor 34 after the switch transistors 31 and 32 are turned OFF, and thus stabilize the current supplied to the organic EL element 15 from the drive transistor 34.

Here, the drive transistor 34 is a drive element that includes a source electrode connected to the positive power supply line 21 and a drain electrode connected to the anode electrode of the organic EL element 15. The drive transistor 34 converts the gate-source voltage into a drain current corresponding to the gate-source voltage. Subsequently, the drive transistor 34 supplies this drain current, as a single current, to the organic EL element 15. The drive transistor 34 is configured of a p-type thin film transistor (p-type TFT).

Here, the organic EL element 15 is a light-emitting element including a cathode connected to the negative power supply line 22, and emits light according to the flow of the signal current via the drive transistor 34. The source electrode and the drain electrode of the drive transistor 34, and the anode electrode and the cathode electrode of the organic EL element 15 are disposed in this order in the current path between the positive power supply line 21 and the negative power supply line 22.

The switch transistor 39 is a third switch element that includes a gate electrode connected to the scanning line 18, one of a source electrode and a drain electrode connected to the source electrode of the drive transistor 34 and the positive power supply line 21, and the other of the source electrode and the drain electrode connected to the electrode 131 of the electrostatic storage capacitor 13. The switch transistor 39 determines the timing for applying the voltage stored in the electrostatic storage capacitor 13 between the gate and the source of the drive transistor 34. The switch transistor 39 is configured of a p-type thin film transistor (p-type TFT). The switch transistor 39 prevents current from flowing to the positive power supply line 21 through the path from the electrode 131 to the switch transistor 39 to the positive power supply line 21, by switching to the non-conducting state at the time of data voltage storing.

Here, the drive operation of the display device according to this modification will be described.

First, the scanning line drive circuit 4 causes the voltage level of the scanning line 18 to change from LOW to HIGH to turn OFF the switch transistor 39. This causes a non-conducting state between the source electrode of the drive transistor 34 and the electrode 131 of the electrostatic storage capacitor 13.

Next, the scanning line drive circuit 4 causes the voltage level of the scanning line 17 to change from HIGH to LOW to turn ON the switch transistors 31 and 32. At this time, the power supply line voltage VDDp of the positive power supply line 21 in the pixel is applied to the electrode 132 of the electrostatic storage capacitor 13, and the data voltage Vdata is applied to the electrode 131 via the data line 16. Furthermore, the source electrode of the drive transistor 14 and the electrode 132 are in the non-conducting state. In addition, although the power supply line voltage VDDp of the positive power supply line 21 is applied to the gate electrode of the drive transistor 34, the drive transistor 34, which is of the p-type, is set to a potential that turns it OFF. Accordingly, at this time, the drain current of the drive transistor 34 does not flow, and thus the organic EL element 15 does not emit light.

Here, it is assumed that the voltage drop Vdrop occurs in the positive power supply line 21 due to the wire resistance of the positive power supply line 21 and the drive current. In other words, where VDD is the positive power supply voltage, the voltage VDD of the positive power supply line 21 is derived as shown below.

[Math. 8]

$$VDDp = VDD - Vdrop \quad \text{(Equation 8)}$$

In the period in which the switch transistors 31 and 32 are ON, an accurate voltage Vdata corresponding to the data voltage and a voltage (VDD−Vdrop) obtained by deducting the voltage drop (rise) Vdrop from the positive power supply voltage VDD are respectively applied to the electrode 131 and the electrode 132 of the electrostatic storage capacitor 13. Therefore, the voltage (Vdata−VDD+Vdrop) is stored in the electrostatic storage capacitor 13.

Next, the scanning line drive circuit 4 causes the voltage level of the scanning line 17 to change from LOW to HIGH to turn OFF the switch transistors 31 and 32. This causes a non-conducting state between the electrode 131 of the electrostatic storage capacitor 13 and the negative power supply line 22, and causes a non-conducting state between the electrode 132 of the electrostatic storage capacitor 13 and the data line 16.

Next, the scanning line drive circuit 4 causes the voltage level of the scanning line 18 to change from HIGH to LOW to turn ON the switch transistor 39. At this time, a conducting state is caused between the source electrode of the drive transistor 34 and the electrode 131 of the electrostatic storage capacitor 13. Furthermore, the electrode 132 of the electrostatic storage capacitor 13 is electrically cut off from the positive power supply line 21, and the electrode 131 is electrically cut off from the data line 16. Therefore, the gate potential of the drive transistor 34 changes together with the change of the source potential, and (Vdata−VDDp), which is the voltage across the electrostatic storage capacitor 13 is applied between the gate and the source.

Due to the flow of drive current to the organic EL element 15, with the potential of the positive power supply line 21 being in the state indicated in Equation 8, the source potential of the drive transistor 34 also drops, together with the potential of the positive power supply line 21, to (VDD−Vdrop). At this time, the gate electrode of the drive transistor 34 is in a floating state, and thus the gate potential drops in accordance with the change of the source potential. Here, a parasitic capacitance is present between the gate electrode and the drain electrode of the drive transistor 34, and the capacitance value of the parasitic capacitance is assumed to be Cpara. In this case, the change in the gate potential ΔVg of the drive transistor 34 is −Vdrop×Cs/(Cs+Cpara) with respect to the change in the source potential −Vdrop. It should be noted that Cs is the capacitance value of the electrostatic storage capacitor 13. Therefore, the source-gate voltage Vsg of the drive transistor 34 is derived from the voltage (Vdata−VDDp) stored in the electrostatic storage capacitor 13, the change in the gate voltage ΔVg, and the change in the source voltage ΔVs, as shown below.

[Math. 9]

$$Vsg = (Vdata - VDDp) - \Delta Vg + \Delta Vs \qquad \text{(Equation 9)}$$

$$= (Vdata - VDD + Vdrop) - \left(\frac{Cs}{Cs + Cpara}\right)(-Vdrop) +$$

$$(-Vdrop)$$

$$= \frac{Cs}{Cs + Cpara} Vdrop + Vdata - VDD$$

Vsg at the start of light emission changes, from the stored voltage (Vdata−VDDp) to that shown in Equation 9, due to the voltage drop in the positive power supply line 21. Since the accurate stored voltage is (Vdata−VDD), the change in Vgs ΔVsg derived from the accurate stored voltage is as shown below.

[Math. 10]

$$\Delta Vsg = \left(\frac{Cs}{Cs + Cpara}\right) Vdrop \qquad \text{(Equation 10)}$$

In other words, compared to the above-mentioned accurate stored voltage, Vsg at the start of light emission is larger by the ΔVsg expressed in Equation 10 above. Furthermore, the larger the voltage drop Vdrop in the positive power supply line 21 is, the larger ΔVsg becomes. Furthermore, a drive current flowing in the organic EL element 15 is expressed as follows:

[Math. 11]

$$Id = \beta(Vsg - Vth)^2 \qquad \text{(Equation 11)}$$

$$= \beta\left[\left(\frac{Cs}{Cs + Cpara}\right) Vdrop + Vdata - VDD + Vth\right]^2$$

Here β and Vth are, respectively, the mobility and threshold voltage of the drive transistor 34. According to Equation 11 above, the drive current Id also increases, and the light emission luminance of the organic EL element 15 increases as a result. Furthermore, the larger the voltage drop Vdrop is, the more the light emission luminance of the organic EL element 15 increases. Therefore, the screen central portion, where voltage drop is large, becomes bright.

While the switch transistor 39 is in the conducting state, the voltage expressed in Equation 9 is continuously applied between the source and the gate, and the current expressed in Equation 11 flows, thus causing the organic EL element 15 to continue to emit light.

The above-described data voltage storing and light emission periods correspond to a 1-frame period in which the light emission intensity of all the pixels is updated, and the above-described operations are also repeated hereafter.

It should be noted that in the drive operation of the display device according to this embodiment described above, the timing for changing the level of the scanning line 17 from HIGH to LOW to store data voltage and the timing for changing the level of the scanning line 18 from LOW to HIGH to cause a non-conducting state between the electrode 131 and the source electrode of the drive transistor 34 may be the same. Furthermore, the timing for changing the level of the scanning line 17 from LOW to HIGH to end the data voltage storing and the timing for changing the level of the scanning line 18 from HIGH to LOW to start light emission may be the same.

As described above, in the display device according to this modification, at the time of data voltage storing, the data voltage Vdata is applied, via the switch transistor 31, to the electrode 131 that is connectable with the source electrode of the drive transistor 34, and the power supply line voltage VDDp of the positive power supply line 21, in which a voltage drop occurs, is applied to the electrode 132 that is connectable with the gate electrode of the drive transistor 34. Accordingly, since a voltage, which is obtained by adding the absolute value of the amount of voltage drop in the power supply line to the absolute value of the data voltage Vdata, is stored in the electrostatic storage capacitor 13, the light emission luminance at the screen central portion, where the amount of voltage drop is larger than at the screen peripheral portion, becomes relatively higher. Therefore, the screen central portion becomes brighter than the screen peripheral portion, and thus high picture quality can be provided.

(Modification 5 of a Pixel Circuit Configuration, which Includes p-Type Drive Transistors)

Figure 10B:
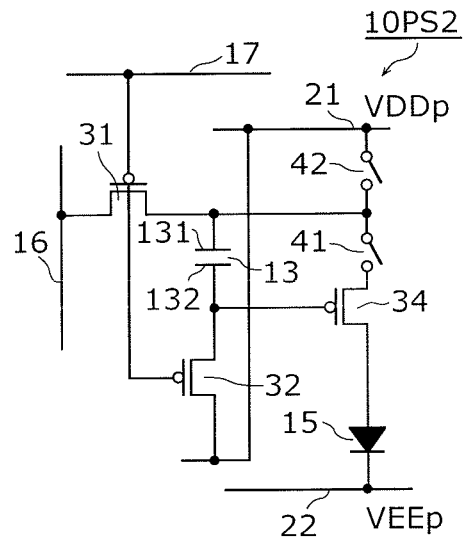
FIG. 10B is a circuit diagram illustrating a fifth modification of the pixel circuit according to the embodiment of the present invention.

FIG. 10B is a circuit diagram illustrating a fifth modification of the pixel circuit according to this embodiment of the present invention. The circuit configuration of a pixel 10PS2 in the figure is different compared to the circuit configuration of the pixel 10PS1 illustrated in FIG. 10A in that switch elements 41 and 42 are provided in place of the switch transistor 39 and the scanning line 18. Hereinafter, description will be carried out centering on the differences from the circuit configuration of the pixel 10PS1 illustrated in FIG. 10A.

Here, the switch element 41 has one end connected to the source electrode of the drive transistor 34 and the other end connected to the electrode 131, and has a function of allowing or cutting off the flow of the drive current from the drive transistor 34.

The switch element 42 has one end connected to the positive power supply line 21 and the other end connected to the electrode 131, and has a function of allowing or cutting off the flow of the drive current from the drive transistor 34.

The switch elements 41 and 42 are each configured of, for example, a thin-film transistor having a gate electrode connected to a scanning line. In this circuit configuration, the switch element 41 is provided to prevent current from flowing through a path from the data line 16 to the switch transistor 31, to the drive transistor 34 to the to the organic EL element 15, when the drive transistor 34 is turned ON by the application of the data voltage Vdata to the source electrode of the drive transistor 34 at the time of data voltage storing. On the other hand, the switch element 42 is provided to prevent the power supply line voltage VDDp from being applied from the positive power supply line 21 to the electrode 131 at the time of data voltage storing. Therefore, the drive timings of the switch elements 41 and 42 are the same as the drive timing of the switch transistor 39 in FIG. 10A. With the above-described circuit configuration and drive timing, a display device in which pixels 10PS2 are arranged in a matrix produces the same advantageous effect as the display device 1 according to the foregoing embodiment.

(Modification 6 of a Pixel Circuit Configuration, which Includes p-Type Drive Transistors)

Figure 10C:
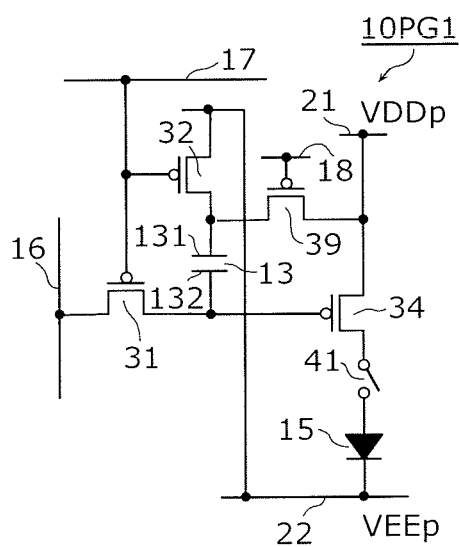
FIG. 10C is a circuit diagram illustrating a sixth modification of the pixel circuit according to the embodiment of the present invention.

FIG. 10C is a circuit diagram illustrating a sixth modification of the pixel circuit according to this embodiment of the present invention. A circuit configuration of a pixel 10PG1 illustrated in the figure includes the switch transistors 31, 32, and 39, the electrostatic storage capacitor 13, the drive transistor 34, the organic EL element 15, the data line 16, the scanning lines 17 and 18, the positive power supply line 21, the negative power supply line 22, and the switch element 41.

Here, the switch transistor 31 is a first switch element that includes a gate electrode connected to the scanning line 17, one of a source electrode and a drain electrode connected to the data line 16, and the other of the source electrode and the drain electrode connected to the electrode 132 of the electrostatic storage capacitor 13. The switch transistor 31 has a function of determining the timing for applying the data voltage of the data line 16 to the electrode 132, by switching between conduction and non-conduction between the electrode 132 (first electrode) of the electrostatic storage capacitor 13 and the data line 16.

Here, the switch transistor 32 is a second switch element that includes a gate electrode connected to the scanning line 17, one of a source electrode and a drain electrode connected to the negative power supply line 22, and the other of the source electrode and the drain electrode connected to the electrode 131 of the electrostatic storage capacitor 13. The switch transistor 32 has a function of determining the timing for applying the power supply line voltage VEEp of the negative power supply line 22 in the pixel 10PG1 to the electrode 131, by switching between conduction and non-conduction between the electrode 131 (second electrode) of the electrostatic storage capacitor 13 and the negative power supply line 22. The switch transistors 31 and 32 are each configured of a p-type thin film transistor (p-type TFT).

Here, the electrostatic storage capacitor 13 is a capacitive element that includes the electrode 132 connected to the gate electrode of the drive transistor 34, and the electrode 131 connected the source electrode of the drive transistor 34 via the switch transistor 39. The electrostatic storage capacitor 13 stores a voltage corresponding to the data voltage supplied from the data line 16, and, for example, stably stores the gate-source voltage of the drive transistor 34 after the switch transistors 31 and 32 are turned OFF, and thus stabilize the current supplied to the organic EL element 15 from the drive transistor 34.

Here, the drive transistor 34 is a drive element that includes a source electrode connected to the positive power supply line 21 and a drain electrode connected to one end of the switch element 41. The drive transistor 34 converts the source-gate voltage into a drain current corresponding to the source-gate voltage. Subsequently, the drive transistor 34 supplies this drain current, as a single current, to the organic EL element 15. The drive transistor 34 is configured of a p-type thin film transistor (p-type TFT).

Here, the organic EL element 15 is a light-emitting element including a cathode connected to the negative power supply line 22, and emits light according to the flow of the signal current via the drive transistor 34 and the switch element 41. The source electrode and the drain electrode of the drive transistor 34, and the anode electrode and the cathode electrode of the organic EL element 15 are disposed in this order in the current path between the positive power supply line 21 and the negative power supply line 22.

Here, the switch transistor 39 is a third switch element that includes a gate electrode connected to the scanning line 18, one of a source electrode and a drain electrode connected to the source electrode of the drive transistor 34, and the other of the source electrode and the drain electrode connected to the electrode 131 of the electrostatic storage capacitor 13. The switch transistor 39, in conjunction with the switch element 41, determines the timing for applying the voltage stored in the electrostatic storage capacitor 13 between the gate and the source of the drive transistor 34. The switch transistor 39 is configured of a p-type thin film transistor (p-type TFT).

Here, the switch element 41 has the other end connected to the anode electrode of the organic EL element 15, and has a function of allowing or cutting off the flow of the drive current from the drive transistor 34. The switch element 41 is configured of, for example, a thin-film transistor having a gate electrode connected to a scanning line. In this circuit configuration, the switch element 41 is provided to prevent the drive current from flowing to the organic EL element 15 and causing light emission, when the drive transistor 34 is turned ON by the application of the data voltage Vdata to the gate electrode of the drive transistor 34 at the time of data voltage storing. On the other hand, the switch transistor 39 is provided to prevent current from flowing through a path from the positive power supply line 21 to the switch transistor 39 to the switch transistor 32 to the negative power supply line 22, at the time of data voltage storing. Therefore, the drive timing of the switch element 41 is the same as the drive timing of the switch transistor 39.

As described above, according to this modification, at the time of data voltage storing, the data voltage Vdata is applied, via the switch transistor 31, to the electrode 132 that is connectable with the gate electrode of the drive transistor 34, and the power supply line voltage VEEp of the negative power supply line 22, in which a voltage drop occurs, is applied to the electrode 131 that is connectable with the source electrode of the drive transistor 34. Accordingly, since a voltage, which is obtained by adding the absolute value of the amount of voltage drop in the power supply line to the absolute value of the data voltage Vdata, is stored in the electrostatic storage capacitor 13, the light emission luminance at the screen central portion, where the amount of voltage drop is larger than at the screen peripheral portion, becomes relatively higher. Therefore, with a display device in which pixels 10PG1 according to this modification are arranged in a matrix, the screen central portion becomes brighter than the screen peripheral portion, and thus high picture quality can be provided.

(Modification 7 of a Pixel Circuit Configuration, which Includes p-Type Drive Transistors)

Figure 10D:
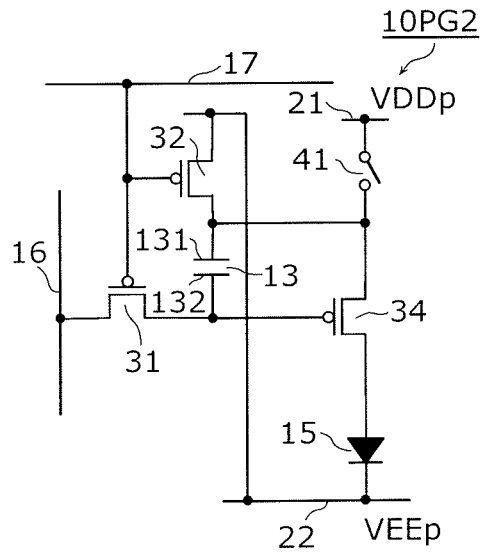
FIG. 10D is a circuit diagram illustrating a seventh modification of the pixel circuit according to the embodiment of the present invention.

FIG. 10D is a circuit diagram illustrating a seventh modification of the pixel circuit according to this embodiment of the present invention. The circuit configuration of a pixel 10PG2 illustrated in the figure is different compared to the circuit configuration of the pixel 10PG1 illustrated in FIG. 10C in that the switch transistor 39 and the scanning line 18 are not present, and the connection position of the switch element 41 is different. Hereinafter, description will be carried out centering on the difference from the circuit configuration of the pixel 10PG1 illustrated in FIG. 10C.

Here, the switch element 41 has on end connected to the positive power supply line 21 and the other end connected to the electrode 131 and the source electrode of the drive transistor 34. The switch element 41, by switching to the non-conducting state at the time of data voltage storing, has a function of cutting off the current path from the positive power supply line 21 to the switch element 41 to the drive transistor 34 to the organic EL element 15 to the negative power supply line 22, and the current path from the positive power supply line 21 to the switch element 41 to the electrode 131 to the switch transistor 32 to the negative power supply line 22. Accordingly, since the current paths are cut off even if the electrostatic storage capacitor 13 and the drive transistor 34 are connected at the time of data voltage storing, a voltage corresponding to the data voltage is stored in the electrostatic storage capacitor 13. The drive timing of the switch element 41 is the same as that of the switch transistor 19 illustrated in FIG. 10C. With the above-described circuit configuration and drive timing, a display device in which pixels 10PG2 are arranged in a matrix produces the same advantageous effect as the display device 1 according to the foregoing embodiment. It should be noted that due to the switch element 41 being disposed in the above described position, the switch transistor 39 is rendered unnecessary.

(Modification 8 of a Pixel Circuit Configuration, which Includes n-Type Drive Transistors)

Figure 11A:
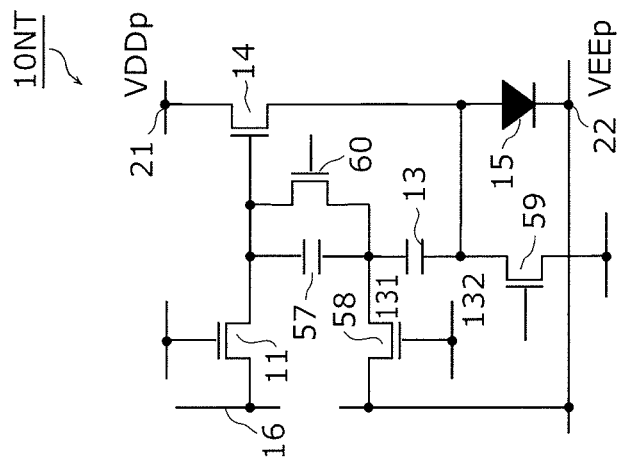
FIG. 11A is a circuit diagram illustrating an eighth modification of the pixel circuit according to the embodiment of the present invention.

FIG. 11A is a circuit diagram illustrating an eighth modification of the pixel circuit according to this embodiment of the present invention. A circuit configuration of a pixel 10NH1 illustrated in the figure includes switch transistors 11, 51, and 54, the electrostatic storage capacitor 13, the drive transistor 14, the organic EL element 15, the data line 16, the positive power supply line 21, the negative power supply line 22, and switch elements 52 and 53.

Here, the switch transistor 11 is a first switch element that includes one of a source electrode and a drain electrode connected to the data line 16, and the other of the source electrode and the drain electrode connected to the electrode 131 (first electrode) of the electrostatic storage capacitor 13. The switch transistor 11 has a function of determining the timing for applying the data voltage of the data line 16 to the electrode 131, by switching between conduction and non-conduction between the electrode 131 and the data line 16.

The switch transistor 51 is a second switch element that includes one of a source electrode and a drain electrode connected to the positive power supply line 21 (first power supply line) and the other of the source electrode and the drain electrode connected to the electrode 131 (first electrode) of the electrostatic storage capacitor 13. The switch transistor 51 has a function of determining the timing for applying the power supply line voltage VDDp of the positive power supply line 21 in the pixel 10NH1 to the electrode 131, by switching between conduction and non-conduction between the electrode 131 and the positive power supply line 21. The switch transistors 11 and 51 are each configured of, for example, an n-type thin film transistor (n-type TFT).

Here, the electrostatic storage capacitor 13 is a first capacitive element that includes the electrode 131 connected to the gate electrode of the drive transistor 14, and the electrode 132 connected the source electrode of the drive transistor 14. The electrostatic storage capacitor 13 stores a voltage corresponding to the data voltage supplied from the data line 16. For example, the electrostatic storage capacitor 13 stably stores the gate-source voltage of the drive transistor 14 after the switch transistors 11 and 51 are turned OFF, and thus stabilize the current supplied to the organic EL element 15 from the drive transistor 14.

Here, the drive transistor 14 is a drive element that includes a drain electrode connected to one end of the switch element 52 and a source electrode connected to one end of the switch element 53. The drive transistor 14 converts the gate-source voltage into a drain current corresponding to the gate-source voltage. Subsequently, the drive transistor 14 supplies this drain current, as a single current, to the organic EL element 15. The drive transistor 14 is configured of, for example, an n-type thin film transistor (n-type TFT).

The switch element 53 is a fourth switch that switches between conduction and non-conduction between the source electrode of the drive transistor 14 and the anode electrode of the organic EL element 15.

Here, the organic EL element 15 is a light-emitting element including a cathode electrode connected to the negative power supply line 22 and an anode electrode connected to the other end of the switch element 53, and emits light according to the flow of the signal current via the drive transistor 14 and the switch element 53. The drain electrode and the source electrode of the drive transistor 14, and the anode electrode and the cathode electrode of the organic EL element 15 are disposed in this order in the current path between the positive power supply line 21 and the negative power supply line 22.

The switch transistor 54 is a fifth switch element that includes one of a source electrode and a drain electrode connected to the source electrode of the drive transistor 14, the electrode 132 of the electrostatic storage capacitor 13, and the one end of the switch element 53, for applying an initialization voltage to the source electrode of the drive transistor 14.

In the above-described circuit configuration, first, in a threshold voltage compensation period, the switch transistor 51 is turned ON, and the power supply line voltage VDDp of the positive power supply line 21 is applied to the gate electrode of the drive transistor 14 and the electrode 131 of the electrostatic storage capacitor 13. At this time, the switch transistor 11 and the switch element 53 are OFF. Accordingly, although a threshold voltage Vth of the drive transistor 14 is stored in the electrostatic storage capacitor 13, a voltage from which the absolute value of the amount of voltage drop in the power supply line has been deducted is applied to the electrode 131, and thus the electrode 132 of a pixel 10NH1 at the screen central portion has a potential that is lower, by the amount of the voltage drop, than that of the electrode 132 of a pixel 10NH1 at the screen peripheral portion.

Next, in the data storing period, the switch transistor 51 is turned OFF and the switch transistor 11 is turned ON, and thus the data voltage of the data line 16 is applied to the gate electrode of the drive transistor 14 and the electrode 131 of the electrostatic storage capacitor 13. At this time, due to the source voltage set in the threshold voltage compensation period, the gate-source voltage of the drive transistor 14 is larger in the pixel 10NH1 at the screen central portion than in the pixel 10NH1 at the screen peripheral portion.

Lastly, by turning OFF the switch transistor 11 and turning ON the switch elements 52 and 53, the organic EL element 15 emits light according to the gate-source voltage of the drive transistor 14.

As described above, according to this modification, in the threshold voltage compensation period, the power supply line voltage VDDp of the positive power supply line 21, in which a voltage drop occurs, is applied to the electrode 131 via the switch transistor 51. With this, the source potential of the drive transistor 14 becomes a potential from which the absolute value of the amount of voltage drop in the power supply line has been deducted. Since the data voltage is stored in the gate electrode of the drive transistor 14 in this state, the light emission luminance at the screen central portion, where the amount of voltage drop is larger than at the screen peripheral portion, becomes relatively brighter. Therefore, with a display device in which pixels 10NH1 according to this modification are arranged in a matrix, the screen central portion becomes brighter than the screen peripheral portion, and thus high picture quality can be provided.

(Modification 9 of a Pixel Circuit Configuration, which Includes n-Type Drive Transistors)

Figure 11B:
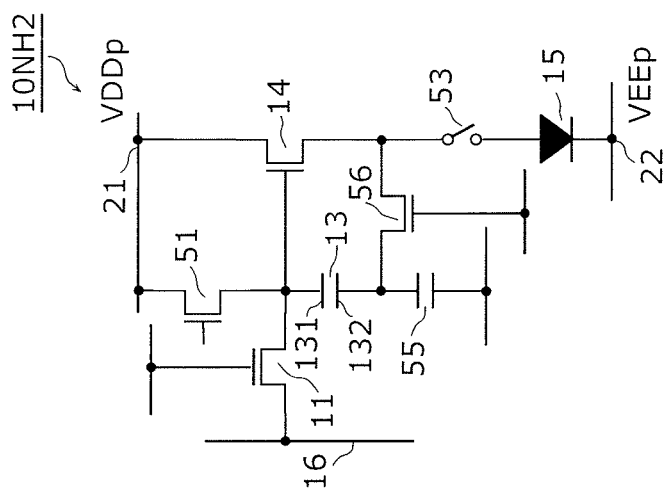
FIG. 11B is a circuit diagram illustrating a ninth modification of the pixel circuit according to the embodiment of the present invention.

FIG. 11B is a circuit diagram illustrating a ninth modification of the pixel circuit according to this embodiment of the present invention. A circuit configuration of a pixel NH2 illustrated in the figure is different compared to the circuit configuration of the pixel 10NH1 illustrated in FIG. 11A in that a switch transistor 56 is provided in place of the switch element 52, and that a electrostatic storage capacitor 55 is provided. Hereinafter, description will be carried out centering on the differences from the circuit configuration of the pixel 10NH1 illustrated in FIG. 11A.

The switch transistor 56 includes one of a source electrode and a drain electrode connected to the source electrode of the drive transistor 14, and the other of the source electrode and the drain electrode connected to the electrode 132 of the electrostatic storage capacitor 13.

The electrostatic storage capacitor 55 is a second capacitive element that includes a third electrode and a fourth electrode. The third electrode is connected to the electrode 132 of the electrostatic storage capacitor 13, and the fourth electrode is connected to an initialization voltage line capable of being set to the initialization voltage.

In the above-described circuit configuration, first, in a threshold voltage compensation period, the switch transistor 51 is turned ON, and the power supply line voltage VDDp of the positive power supply line 21 is applied to the gate electrode of the drive transistor 14 and the electrode 131 of the electrostatic storage capacitor 13. At this time, the switch transistor 11 and the switch element 53 are OFF. Furthermore, at this time, the switch transistor 56 is ON, and thus, although the threshold voltage Vth of the drive transistor 14 is stored in the electrostatic storage capacitor 13, a voltage from which the absolute value of the amount of voltage drop in the power supply line has been deducted is applied to the electrode 131. With this, the electrode 132 of a pixel 10NH2 at the screen central portion has a potential that is lower, by the amount of the voltage drop, than that of the electrode 132 of a pixel 10NH2 at the screen peripheral portion.

Next, in the data storing period, the switch transistors 51 and 56 are turned OFF and the switch transistor 11 is turned ON, and thus the data voltage of the data line 16 is applied to the gate electrode of the drive transistor 14 and the electrode 131 of the electrostatic storage capacitor 13. At this time, due to the potential of the electrode 132 that is set in the threshold voltage compensation period, the voltage across the electrostatic storage capacitor 13 is larger in the pixel 10NH2 at the screen central portion than in the pixel 10NH2 at the screen peripheral portion.

Lastly, by turning OFF the switch transistor 11 and turning ON the switch transistor 56 and the switch element 53, the organic EL element 15 emits light according to the voltage across the drive transistor 13.

As described above, according to this modification, in the threshold voltage compensation period, the power supply line voltage VDDp of the positive power supply line 21, in which a voltage drop occurs, is applied to the electrode 131 via the switch transistor 51. With this, the source potential of the drive transistor 14 and the potential of the electrode 132 become potentials from which the amount of voltage drop in the power supply line has been deducted. Since the data voltage is stored in the gate electrode of the drive transistor 14 and the electrode 131 in this state, the light emission luminance at the screen central portion, where the amount of voltage drop is larger than at the screen peripheral portion, becomes relatively brighter. Therefore, with a display device in which pixels 10NH2 according to this modification are arranged in a matrix, the screen central portion becomes brighter than the screen peripheral portion, and thus high picture quality can be provided.

(Modification 10 of a Pixel Circuit Configuration, which Includes n-Type Drive Transistors)

Figure 11C:
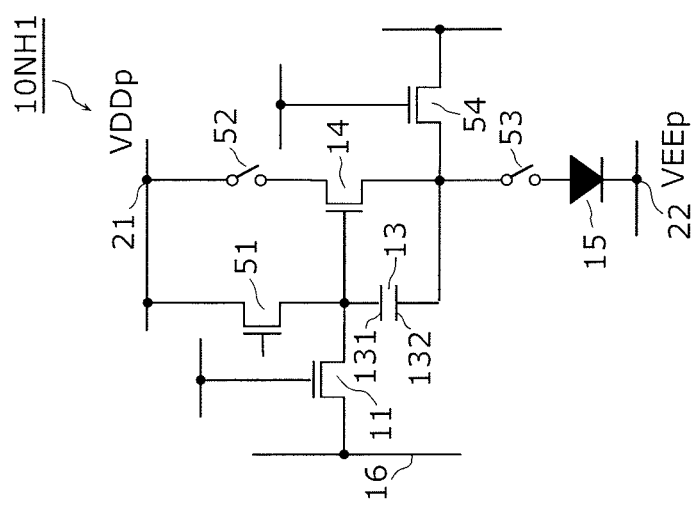
FIG. 11C is a circuit diagram illustrating a tenth modification of the pixel circuit according to the embodiment of the present invention.

FIG. 11C is a circuit diagram illustrating a tenth modification of the pixel circuit according to this embodiment of the present invention. A circuit configuration of a pixel 10NT illustrated in the figure includes switch transistors 11, 58, 59, and 60, electrostatic storage capacitors 13 and 57, the drive transistor 14, the organic EL element 15, the data line 16, the positive power supply line 21, and the negative power supply line 22.

Here, the switch transistor 11 is a first switch element that includes one of a source electrode and a drain electrode connected to the data line 16, and the other of the source electrode and the drain electrode connected to a third electrode of the electrostatic storage capacitor 57. The switch transistor 11 has a function of determining the timing for applying the data voltage of the data line 16 to the third electrode, by switching between conduction and non-conduction between the third electrode and the data line 16.

The drive transistor 14 is a drive element that includes a drain electrode connected to the positive power supply line 21 and a source electrode connected to the anode electrode of the organic EL element 15. The drive transistor 14 converts the gate-source voltage into a drain current corresponding to the gate-source voltage. Subsequently, the drive transistor 14 supplies this drain current, as a single current, to the organic EL element 15. The drive transistor 14 is configured of, for example, an n-type thin film transistor (n-type TFT).

Here, the organic EL element 15 is a light-emitting element including a cathode electrode connected to the negative power supply line 22, and emits light according to the flow of the signal current via the drive transistor 14. The drain electrode and the source electrode of the drive transistor 14, and the anode electrode and the cathode electrode of the organic EL element 15 are disposed in this order in the current path between the positive power supply line 21 and the negative power supply line 22.

The electrostatic storage capacitor 57 is a second capacitive element that includes the third electrode and a fourth electrode. The third electrode is connected to the gate electrode of the drive transistor 14. The electrostatic storage capacitor 57 makes up a capacitor unit that stores a voltage corresponding to the data voltage from the data line 16, and, for example, stably holds a voltage applied to the gate of the drive transistor 14 in the threshold voltage compensation period, after the switch transistor 11 is turned OFF.

Here, the electrostatic storage capacitor 13 is a first capacitive element that includes the electrode 132 connected the source electrode of the drive transistor 14. The electrostatic storage capacitor 13 stores a voltage set to the source electrode of the drive transistor 14 (corresponding to the source voltage), and, for example, and stably stores the gate-source voltage of the drive transistor 14 after the switch transistor 58 is turned OFF and the switch transistor 60 is turned ON, and thus stabilize the current supplied to the organic EL element 15 from the drive transistor 14

The switch transistor 58 is a second switch element that includes one of a source electrode and a drain electrode connected to the negative power supply line 22 (second power supply line), and the other of the source electrode and the drain electrode connected to the electrode 131 (first electrode) of the electrostatic storage capacitor 13. The switch transistor 58 has a function of determining the timing for applying the power supply line voltage VEEp of the negative power supply line 22 in the pixel 10NT to the electrode 131, by switching between conduction and non-conduction between the electrode 131 and the negative power supply line 22. The switch transistors 11 and 58 are each configured of, for example, an n-type thin film transistor (n-type TFT).

The switch transistor 59 is a seventh switch element for applying the initialization voltage to the electrode 132 of the electrostatic storage capacitor 13.

The switch transistor 60 is a sixth switch element that includes one of a source electrode and a drain electrode connected to the gate electrode of the drive transistor 14, and the other of the source electrode and the drain electrode connected to the electrode 131 of the electrostatic storage capacitor 13. The switch transistor 60 is configured of, for example, an n-type thin film transistor (n-type TFT).

In the above-described circuit configuration, first, in a data voltage storing period, the switch transistors 11 and 58 are turned ON, and the data voltage–Vdata of the data line 16 is applied to the gate electrode of the drive transistor 14 and the third electrode of the electrostatic storage capacitor 57.

Next, in the threshold voltage compensation period, the switch transistor 11 is turned OFF and the switch transistor 58 is turned ON, and the power supply line VEEp of the negative power supply line 22 is applied to the electrode 131 of the electrostatic storage capacitor 13. At this time, although a voltage VEEp−(−Vdata−Vth)=VEEp+Vdata+Vth obtained by superimposing the threshold voltage Vth of the drive transistor 14 onto the data voltage is stored in the electrostatic storage capacitor 13, a voltage to which the absolute value of the amount of the voltage rise in the power supply line has been added is applied to the electrode 131, and thus the electrode 131 of a pixel 10NT at the screen central portion has a potential that is higher, by the amount of the voltage rise, than that of the electrode 131 of a pixel 10NT at the screen peripheral portion.

Lastly, by turning OFF the switch transistor 58 and turning ON the switch transistor 60, the organic EL element 15 emits light according to the gate-source voltage of the drive transistor 14.

At this time, due to the voltage VEEp+Vdata+Vth set in the electrostatic storage capacitor 13 in the threshold voltage compensation period, the gate-source voltage of the drive transistor 14 is larger in the pixel 10NT at the screen central portion than in the pixel 10NT at the screen peripheral portion.

As described above, according to this modification, in the threshold voltage compensation period, the power supply line voltage VEEp of the negative power supply line 22, in which a voltage rise occurs, is applied to the electrode 131 via the switch transistor 58. With this, the voltage across the electrostatic storage capacitor 13 becomes a potential to which the absolute value of the amount of voltage rise in the power supply line has been added. Since the electrostatic storage capacitor 13 is connected to the gate electrode of the drive transistor 14 in this state, the light emission luminance at the screen central portion, where the amount of voltage rise is larger than at the screen peripheral portion, becomes relatively higher. Therefore, with a display device in which pixels 10NT according to this modification are arranged in a matrix, the screen central portion becomes brighter than the screen peripheral portion, and thus high picture quality can be provided.

Although an embodiment and modifications have been described thus far, the display device according to the present invention is not limited to the above-described embodiment and modifications. The present invention includes other embodiments implemented through a combination of arbitrary structural elements of the embodiment and modifications, or modifications obtained through the application of various modifications to embodiment and the modifications, that may be conceived by a person of ordinary skill in the art, that do not depart from the essence of the present invention, or various devices in which the display device according to the present invention is built into.

It should be noted that although the forgoing embodiment and Modifications 1 to 10 exemplify a configuration in which, in all of the pixel circuit configurations, the drive transistor and the organic EL element 15 are disposed between the positive power supply line 21 and the negative power supply line 22 in the order of the drive transistor and the organic EL element 15, a configuration in which the drive transistor and the organic EL element 15 are disposed between the positive power supply line 21 and the negative power supply line 22 in the order of the organic EL element 15 and the drive transistor, is also included in the scope of the present invention. In other words, the display device according to the present invention, regardless of whether the drive transistor is of the n-type or the p-type, is not limited by the order in which the drive transistor and the organic EL element are disposed, and it is sufficient that the drain electrode and the source electrode of the drive transistor and the anode electrode and the cathode electrode of the organic EL element are disposed in the current path between the positive power supply line 21 and the negative power supply line 22.

It should be noted that although the switch transistors 11 and 31 (first switch element) and the switch transistors 12 and 32 (second switch element) are controlled simultaneously through the same scanning line 17 in the forgoing embodiment, each of the first switch element and the second switch element may be turned ON/OFF independently of the other through mutually different scanning lines. In this case, the application of data voltage from the data line 16 to the electrostatic storage capacitor 13 and the application of power supply line voltage from the positive power supply line or the negative supply line to the electrostatic storage capacitor 13 are controlled using independent timings. This also allows for the execution of the light emission duty control in a 1-frame period.

Furthermore, although description is carried out in the forgoing embodiment of the present invention under the presumption that the switch transistors are FETs that include a gate electrode, a source electrode, and a drain electrode, a bipolar transistor that includes a base, a collector, and an emitter may be applied to these transistors. Even in such a case, the object of the present invention is achieved and the same advantageous effect is produced.

Figure 12:
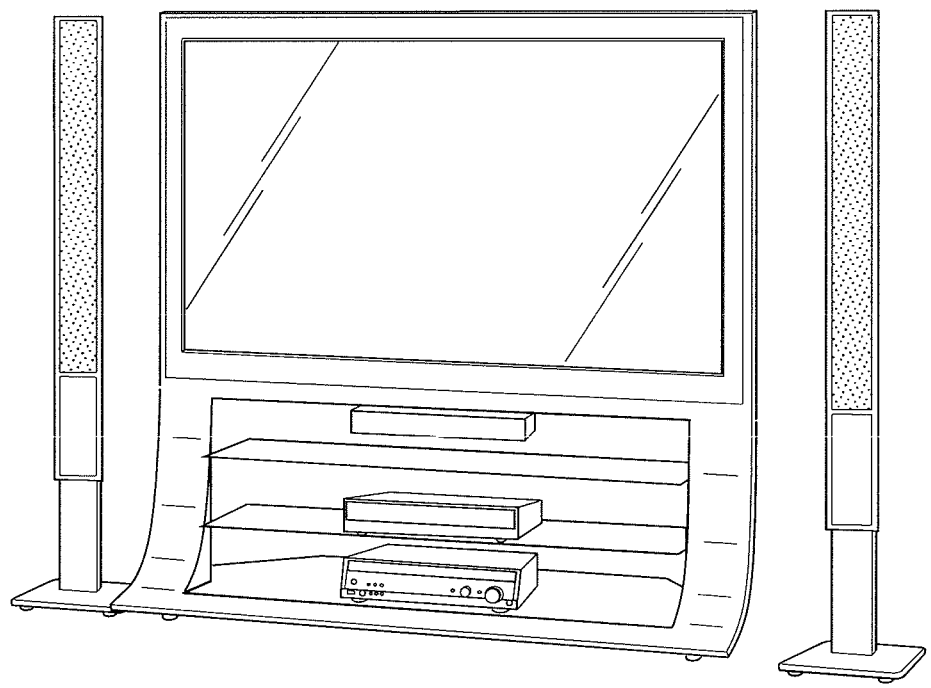
FIG. 12 is an external view of a thin flat-screen TV incorporating a display device according to the present invention.
Figure 13:
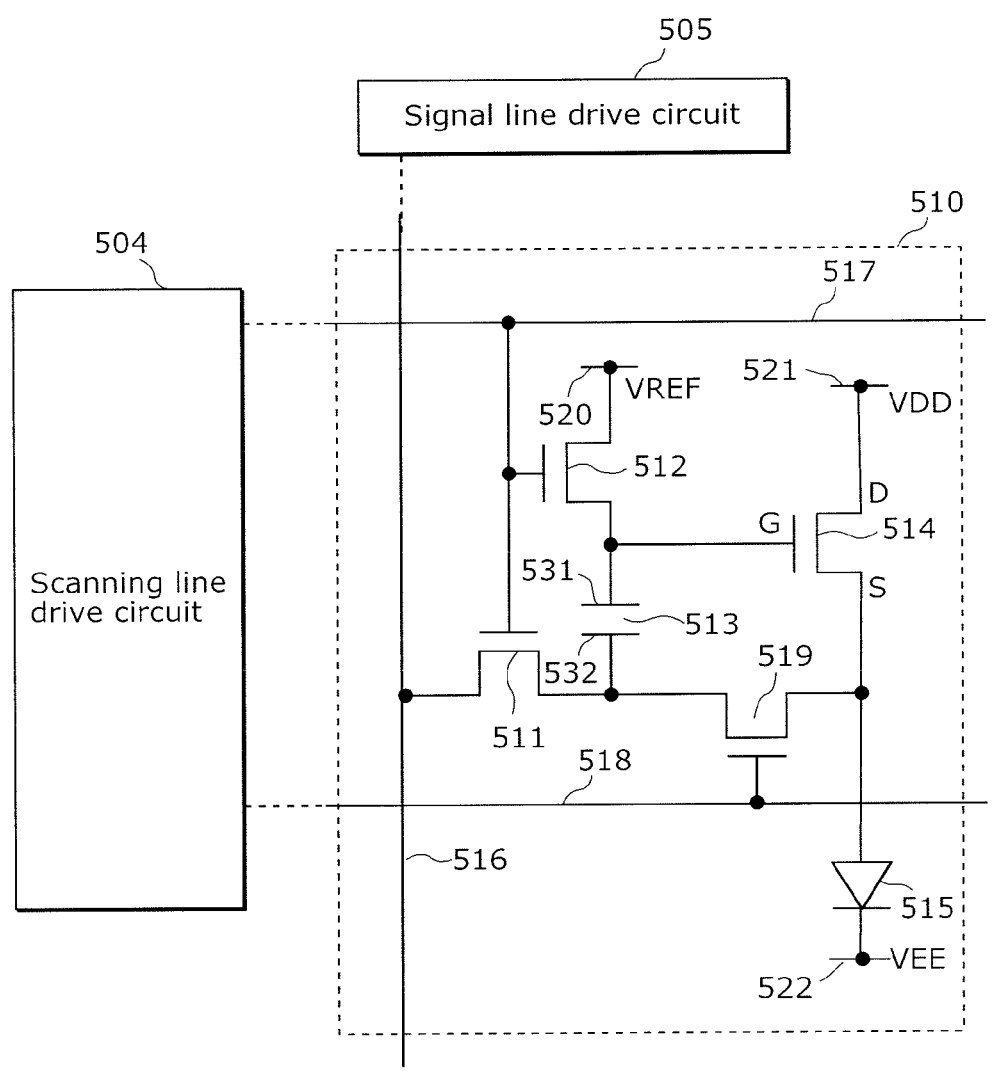
FIG. 13 is a diagram illustrating a circuit configuration of a pixel included in an image display device disclosed in PTL 1.

Furthermore, for example, a display device according to the present invention is built into a thin flat-screen TV such as that shown in FIG. 12. A thin flat-screen TV capable of image display which, while reflecting a video signal, has a bright screen central portion is implemented by having the display device according to the present invention built into the TV.

INDUSTRIAL APPLICABILITY

The present invention is particularly useful in an active-type organic EL flat panel display which causes luminance to fluctuate by controlling pixel light emission intensity according to a pixel signal current.

REFERENCE SIGNS LIST

1 Display device
2 Control circuit
4, 504 Scanning line driving circuit
5, 505 Signal line drive circuit
6 Display unit
10, 10NG1, 10NG2, 10NS, 10NH1, 10NH2, 10NT, 10PG1, 10PG2, 10PS1, 10PS2, 510 Pixel
11, 12, 19, 31, 32, 39, 51, 54, 56, 58, 59, 60, 511, 512, 519 Switch transistor
13, 55, 57, 513 Electrostatic storage capacitor
14, 34, 514 Drive transistor
15, 515 Organic EL element
16, 516 Data line
17, 18, 517, 518 Scanning line
21, 521 Positive power supply line
22, 522 Negative power supply line
30, 530 Parasitic capacitance
41, 42, 52, 53 Switch element
131, 132, 531, 532 Electrode
520 Reference power supply line

The invention claimed is:

1. A display device comprising a display unit in which a plurality of light-emitting pixels are arranged,
wherein each of the plurality of light-emitting pixels includes:
a first power supply line;
a second power supply line;
a drive transistor that includes a source electrode and a drain electrode that are disposed in a current path between the first power supply line and the second power supply line, and drives a current in the current path according to a gate-source voltage;
a light-emitting element that includes an anode electrode and a cathode electrode that are disposed in the current path, and emits light according to the current;
a capacitive element that includes a first electrode and a second electrode, and stores the gate-source voltage of the drive transistor when the first electrode is electrically connected to a gate electrode of the drive transistor and the second electrode is electrically connected to the source electrode of the drive transistor;
a first switch element that switches between conduction and non-conduction between one of the first electrode and the second electrode of the capacitive element and a data line that transmits a data voltage corresponding to luminance; and
a second switch element for applying a reference voltage to an other of the first electrode and the second electrode of the capacitive element,
a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line,
the reference voltage in each of the plurality of light-emitting pixels is set according to one of the first power supply line voltage and the second power supply line voltage of the light-emitting pixel,
in a storing period for storing data voltage, causing the first switch element and the second switch element to switch to conduction causes a voltage to be stored in the capacitive element, the voltage being obtained by adding, to the data voltage, a voltage equivalent to one of an amount of voltage drop and an amount of voltage rise in one of the first power supply line and the second power supply line, and
in a light emission period, the light-emitting element emits light according to the voltage stored in the capacitive element.

2. The display device according to claim 1,
wherein in at least one light-emitting pixel of the plurality of light-emitting pixels:
the drive transistor is of an n-type;
the drain electrode and the source electrode of the drive transistor and the anode electrode and the cathode electrode of the light-emitting element are disposed in the current path;
the reference voltage is the second power supply line voltage of the at least one light-emitting pixel;
the first switch element switches between conduction and non-conduction between the second electrode of the capacitive element and the data line; and
the second switch element switches between conduction and non-conduction between the first electrode of the capacitive element and the second power supply line.

3. The display device according to claim 1,
wherein in at least one light-emitting pixel of the plurality of light-emitting pixels:
the drive transistor is of an n-type;

the drain electrode and the source electrode of the drive transistor and the anode electrode and the cathode electrode of the light-emitting element are disposed in the current path;

the reference voltage is the first power supply line voltage of the at least one light-emitting pixel;

the first switch element switches between conduction and non-conduction between the first electrode of the capacitive element and the data line; and the second switch element switches between conduction and non-conduction between the second electrode of the capacitive element and the first power supply line.

4. The display device according to claim 1, wherein in at least one light-emitting pixel of the plurality of light-emitting pixels:

the drive transistor is of an p-type;

the drain electrode and the source electrode of the drive transistor and the anode electrode and the cathode electrode of the light-emitting element are disposed in the current path;

the reference voltage is the first power supply line voltage of the at least one light-emitting pixel;

the first switch element switches between conduction and non-conduction between the second electrode of the capacitive element and the data line; and the second switch element switches between conduction and non-conduction between the first electrode of the capacitive element and the first power supply line.

5. The display device according to claim 1, wherein in at least one light-emitting pixel of the plurality of light-emitting pixels:

the drive transistor is of an p-type;

the drain electrode and the source electrode of the drive transistor and the anode electrode and the cathode electrode of the light-emitting element are disposed in the current path;

the reference voltage is the second power supply line voltage of the at least one light-emitting pixel;

the first switch element switches between conduction and non-conduction between the first electrode of the capacitive element and the data line; and the second switch element switches between conduction and non-conduction between the second electrode of the capacitive element and the second power supply line.

6. The display device according to claim 1, wherein each of the plurality of light-emitting pixels further includes a third switch element that switches between conduction and non-conduction between the source electrode of the drive transistor and the second electrode of the capacitive element.

7. The display device according to claim 1, wherein the drive transistor is of an enhancement type.

8. The display device according to claim 1, wherein the second power supply line is a common electrode that is one of the anode electrode and the cathode electrode of the light-emitting element formed in common for the plurality of light-emitting pixels, and one light-emitting pixel of the plurality of light-emitting pixels has a connection point at which one of a source electrode and a drain electrode of the second switch element and the common electrode corresponding to the light-emitting pixel are electrically connected.

9. The display device according to claim 8, wherein the connection point is provided one for each of the plurality of light-emitting pixels.

10. The display device according to claim 8, wherein the connection point is provided in common for two or more adjacent light-emitting pixels of the plurality of light-emitting pixels.

11. The display device according to claim 8, wherein the common electrode is formed from a conductive metal oxide.

12. The display device according to claim 8, wherein the common electrode is formed from a material having a sheet resistance of at least 1 Ω/sq.

13. A display device comprising a display unit in which a plurality of light-emitting pixels are arranged, wherein each of the plurality of light-emitting pixels includes:

a first power supply line;

a second power supply line;

a drive transistor that includes a source electrode and a drain electrode that are disposed in a current path between the first power supply line and the second power supply line, and drives a current in the current path according to a gate-source voltage;

a light-emitting element that includes an anode electrode and a cathode electrode, and emits light according to the current;

a first capacitive element that includes a first electrode and a second electrode, and stores the gate-source voltage of the drive transistor when the first electrode is electrically connected to a gate electrode of the drive transistor and the second electrode is electrically connected to the source electrode of the drive transistor;

a first switch element that switches between conduction and non-conduction between the first electrode of the first capacitive element and a data line that transmits a data voltage corresponding to luminance;

a second switch element for applying a reference voltage to the first electrode of the first capacitive element; and a fourth switch element that switches between conduction and non-conduction between the source electrode of the drive transistor and the anode electrode of the light-emitting element, a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line, the reference voltage in each of the plurality of light-emitting pixels is set according to one of the first power supply line voltage and the second power supply line voltage of the light-emitting pixel, in a threshold voltage compensation period, causing the second switch element to switch to conduction causes one of the first power supply line voltage and the second power supply line voltage to be applied to the gate electrode of the drive transistor and a threshold voltage of the drive transistor to be stored in the first capacitive element, in a storing period for storing data voltage, causing the first switch element to switch to conduction causes a voltage to be stored in the first capacitive element, the voltage being obtained by adding, to the data voltage and the threshold voltage, a voltage equivalent to one of an amount of voltage drop and an amount of voltage rise in one of the first power supply line and the second power supply line, and in a light emission period, causing the fourth switch element to switch to conduction causes the light-emitting element to emit light according to the voltage stored in the first capacitive element.

14. The display device according to claim 13,
wherein the reference voltage is the first power supply line voltage of the light-emitting pixel,
each of the plurality of light-emitting pixels further includes a fifth switch element for applying an initialization voltage for compensating for the threshold voltage of the drive transistor, to one of the source electrode and the drain electrode of the drive transistor, and
in a period up to a start of the threshold voltage compensation period, the fifth switch element is caused to switch to conduction.

15. The display device according to claim 13,
wherein the reference voltage is the first power supply line voltage of the light-emitting pixel, and
each of the plurality of light-emitting pixels further includes a second capacitive element that includes a third electrode and a fourth electrode, the third electrode being electrically connected to the second electrode of the first capacitive element, the fourth electrode being electrically connected to an initialization voltage line capable of being set to an initialization voltage for compensating for the threshold voltage of the drive transistor.

16. The display device according to claim 13,
wherein the second power supply line is a common electrode that is one of the anode electrode and the cathode electrode of the light-emitting element formed in common for the plurality of light-emitting pixels, and
one light-emitting pixel of the plurality of light-emitting pixels has a connection point at which one of a source electrode and a drain electrode of the second switch element and the common electrode corresponding to the light-emitting pixel are electrically connected.

17. The display device according to claim 16,
wherein the connection point is provided one for each of the plurality of light-emitting pixels.

18. The display device according to claim 16,
wherein the connection point is provided in common for two or more adjacent light-emitting pixels of the plurality of light-emitting pixels.

19. The display device according to claim 16,
wherein the common electrode is formed from a conductive metal oxide.

20. The display device according to claim 16,
wherein the common electrode is formed from a material having a sheet resistance of at least 1 Ω/sq.

21. A display device comprising a display unit in which a plurality of light-emitting pixels are arranged,
wherein each of the plurality of light-emitting pixels includes:
a first power supply line;
a second power supply line;
a drive transistor that includes a source electrode and a drain electrode that are disposed in a current path between the first power supply line and the second power supply line, and drives a current in the current path according to a gate-source voltage;
a light-emitting element that includes an anode electrode and a cathode electrode that are disposed in the current path, and emits light according to the current;
a first capacitive element that includes a first electrode and a second electrode, the second electrode being electrically connected to the source electrode of the drive transistor;
a second capacitive element that includes a third electrode and a fourth electrode, the third electrode being electrically connected to a gate electrode of the drive transistor, the fourth electrode being electrically connected to the first electrode of the first capacitive element;
a first switch element that switches between conduction and non-conduction between the third electrode of the second capacitive element and a data line that transmits a data voltage corresponding to luminance;
a second switch element for applying a reference voltage to the first electrode of the first capacitive element; and
a sixth switch element connected to the first electrode of the first capacitance element and the gate electrode of the drive transistor,
a potential difference in each of the plurality of light emitting pixels decreases with proximity to a center of the display unit, the potential difference being a difference between a first power supply line voltage which is a voltage of the first power supply line and a second power supply line voltage which is a voltage of the second power supply line,
the reference voltage in each of the plurality of light-emitting pixels is set according to one of the first power supply line voltage and the second power supply line voltage of the light-emitting pixel,
in a storing period for storing data voltage, causing the first switch element to switch to conduction causes a voltage corresponding to the data voltage to be stored in the second capacitive element,
in a threshold voltage compensation period, causing the second switch to switch to conduction causes one of the first power supply line voltage and the second power supply line voltage to be applied to the first electrode of the first capacitive element, and causes a voltage corresponding to the data voltage, a voltage equivalent to one of an amount of voltage drop and an amount of voltage rise in one of the first power supply line and the second power supply line, and the threshold voltage of the drive transistor, to be stored in the first capacitive element, and
in a light emission period, causing the sixth switch element to switch to conduction causes the light-emitting element to emit light according to the voltage stored in the first capacitive element.

22. The display device according to claim 21,
wherein the reference voltage is the second power supply line voltage of the light-emitting pixel,
each of the plurality of light-emitting pixels further includes a seventh switch element for applying an initialization voltage for compensating for the threshold voltage of the drive transistor, to the second electrode of the first capacitive element, and
in a period up to a start of the threshold voltage compensation period, the seventh switch element is caused to switch to conduction.

23. The display device according to claim 21,
wherein the second power supply line is a common electrode that is one of the anode electrode and the cathode electrode of the light-emitting element formed in common for the plurality of light-emitting pixels, and
one light-emitting pixel of the plurality of light-emitting pixels has a connection point at which one of a source electrode and a drain electrode of the second switch element and the common electrode corresponding to the light-emitting pixel are electrically connected.

24. The display device according to claim 23, wherein the connection point is provided one for each of the plurality of light-emitting pixels.

25. The display device according to claim 23, wherein the connection point is provided in common for two or more adjacent light-emitting pixels of the plurality of light-emitting pixels.

26. The display device according to claim 23, wherein the common electrode is formed from a conductive metal oxide.

27. The display device according to claim 23, wherein the common electrode is formed from a material having a sheet resistance of at least 1 Ω/sq.

* * * * *